United States Patent [19]
Matsumoto et al.

[11] Patent Number: 6,151,120
[45] Date of Patent: Nov. 21, 2000

[54] EXPOSURE APPARATUS AND METHOD

[75] Inventors: Takahiro Matsumoto; Hideki Ina, both of Utsunomiya, Japan

[73] Assignee: Canon Kabushiki Kaisha, Tokyo, Japan

[21] Appl. No.: 09/198,443

[22] Filed: Nov. 24, 1998

[30] Foreign Application Priority Data

Nov. 26, 1997 [JP] Japan .................................. 9-340640

[51] Int. Cl.$^7$ .................................................. G01B 11/00
[52] U.S. Cl. ........................................ 356/399; 356/400
[58] Field of Search ..................... 356/399–401

[56] References Cited

U.S. PATENT DOCUMENTS

| | | | |
|---|---|---|---|
| 4,037,969 | 7/1977 | Feldman et al. | 356/172 |
| 4,669,883 | 6/1987 | Ina et al. | 356/401 |
| 4,883,359 | 11/1989 | Ina et al. | 356/401 |
| 4,901,109 | 2/1990 | Mitome et al. | 355/68 |
| 5,323,207 | 6/1994 | Ina | 355/53 |
| 5,559,598 | 9/1996 | Matsumoto | 356/356 |
| 5,610,718 | 3/1997 | Sentoku et al. | 356/363 |
| 5,682,239 | 10/1997 | Matsumoto et al. | 356/349 |

FOREIGN PATENT DOCUMENTS

| | | |
|---|---|---|
| 62-261003 | 11/1987 | Japan . |
| 10-335241 | 12/1998 | Japan . |

*Primary Examiner*—Frank G. Font
*Assistant Examiner*—Michael P. Stafira
*Attorney, Agent, or Firm*—Fitzpatrick, Cella, Harper & Scinto

[57] ABSTRACT

In this exposure apparatus, a wafer formed with a first alignment mark and a mask formed with a second alignment mark at a position outside the exposure field angle are aligned. The exposure apparatus includes an alignment detection system for optically detecting any positional deviation between the first and second alignment marks, a calculator for calculating any positional deviation between a first pattern formed on the wafer and a second pattern formed on the mask on the basis of the detection result of the alignment detection system, the position of the first alignment mark in the wafer, and the position of the second alignment mark in the mask, and an actuator for driving a wafer stage on the basis of the calculation result of the calculator to make the first and second patterns overlap each other.

33 Claims, 17 Drawing Sheets

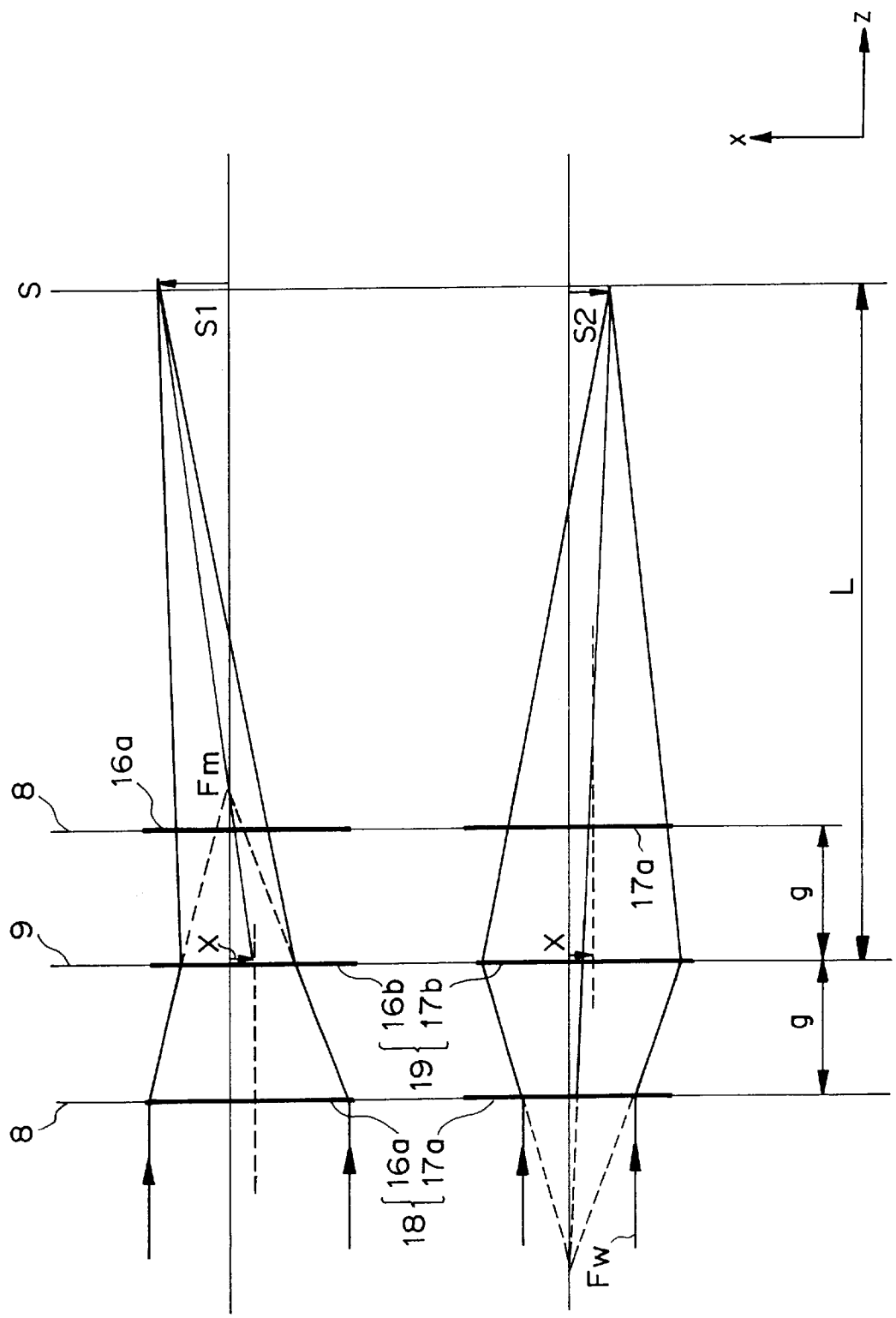

FIRST MASK

SECOND MASK

FIRST MASK

SECOND MASK

X-MEASUREMENT

Y-MEASUREMENT

EXPOSURE

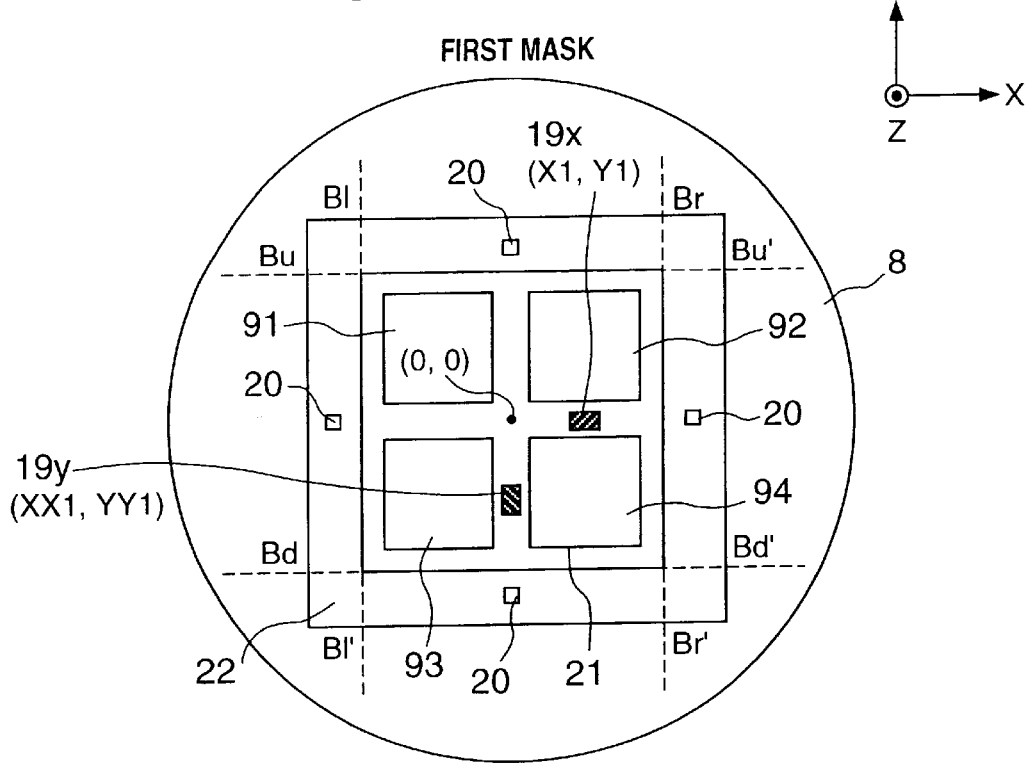
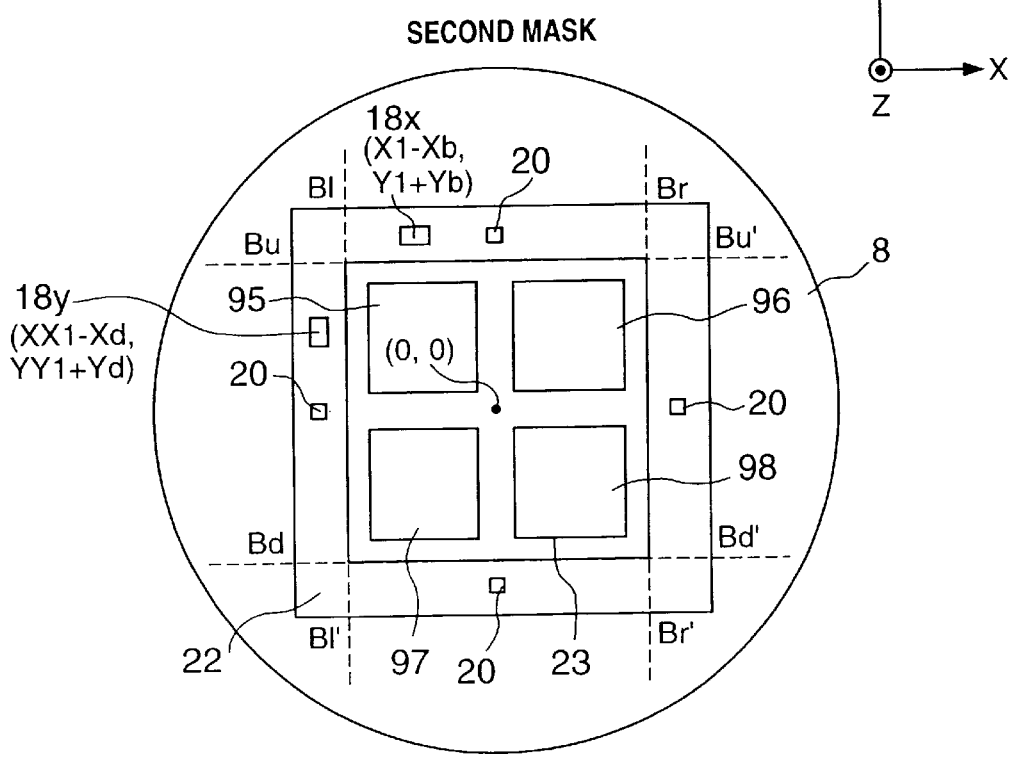

UPON EXPOSURE OF n-TH SHOT

UPON EXPOSURE OF (n+1)-TH SHOT

SYNTHESIS

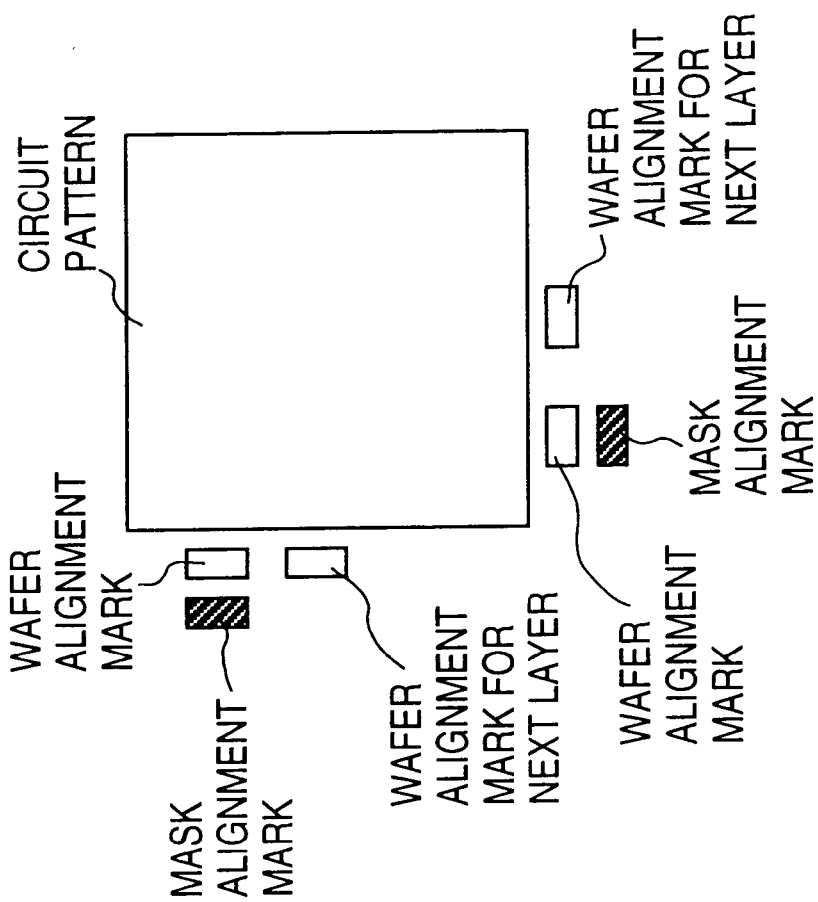
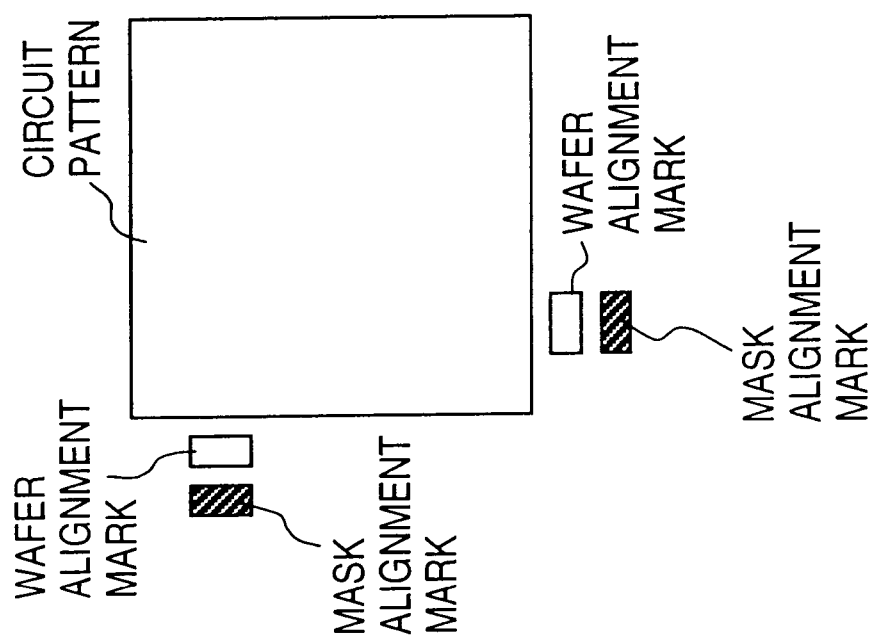

EXPOSURE APPARATUS AND METHOD

BACKGROUND OF THE INVENTION

1. Field of the Invention

The present invention relates to an exposure apparatus and method for aligning a wafer and mask and transferring a pattern on the mask onto a wafer.

2. Description of the Related Art

Conventionally, in an exposure apparatus for manufacturing semiconductor integrated circuits, an improvement in relative alignment precision between the mask and wafer is an important factor upon improving the performance. Taking a DRAM as a representative semiconductor integrated circuit as an example, total overlap precision around 1/3 to 1/4 of the minimum line width is required, and recently, an alignment precision of 20 nm or less is required due to highly integrated semiconductors. Of such precision values, an alignment precision required for the exposure apparatus is as strict as 10 nm to 15 nm.

In many exposure apparatuses, positional deviations of marks for alignment respectively formed on a mask and wafer, i.e., alignment marks, are optically detected, and the mask and wafer are aligned based on the detection value.

Methods of detecting the positional deviation include a method of projecting the alignment marks onto a CCD by optically enlarging them, and processing the projected images, a method of measuring the phase of light diffracted by linear diffraction gratings used as the alignment marks (Japanese Patent Laid-Open No. 62-261003), a method of detecting the positional deviation of light diffracted by zone plates (grating lenses), used as the alignment marks, on a predetermined plane (U.S. Pat. No. 4,037,969), and the like.

In any of these detection methods, alignment is done by driving the mask or wafer so that the positional deviation between the alignment marks on the mask and those on the wafer becomes equal to or smaller than a predetermined amount, and exposure is then made.

FIG. 16 shows the alignment method disclosed in Japanese Patent Laid-Open No. 62-261003. Linear gratings 135 serving as alignment marks are formed on a mask 141, and linear gratings 136 serving as alignment marks are formed on a wafer 142. These marks are irradiated with alignment beams 137 and 138 (frequencies f1 and f2) from two sides, and light beams 139 and 140 diffracted by the respective diffraction gratings are received. Then, the positional deviation between the marks 135 and 136 is measured based on the phase difference between the two diffracted light beams.

However, when exposure is made after the marks on the mask and wafer are aligned in this way, the alignment marks on the mask are transferred on or in the vicinity of those on the wafer, as shown in FIG. 17A. For this reason, the next layer cannot use the same wafer alignment marks, and alignment marks must be updated in turn, as shown in FIG. 17B.

Hence, mask marks and wafer marks must be formed at different positions in units of layers. The alignment marks of the wafer are normally located on a dicing margin called a scribe line, and other marks such as a CD evaluation pattern, overlay precision evaluation pattern, and the like are also located on the scribe line. For this reason, when the alignment marks require a larger area, other patterns cannot be formed.

In order to solve such a problem, the width of the scribe line must be increased. However, when the scribe line is made thicker, the number of shots on the wafer decreases, resulting in an increasing in the IC manufacturing cost. Since the number of layers is expected to grow in the manufacture of future devices, such a problem cannot be ignored.

When the alignment marks are updated, the exposure apparatus must have a stage system for driving an alignment detection system to trace the marks, resulting in high apparatus cost.

Furthermore, in a proximity exposure apparatus that uses, e.g., X-rays as an exposure light source, exposure light must be prevented from being intercepted by an alignment optical system upon exposure. For this purpose, the alignment system must be removed from the field angle upon exposure, or the alignment beams 137 and 138 are obliquely radiated to fall outside a plane determined by lines A1A1' and C1C1' perpendicular to the detection direction of the alignment marks, and light-receiving sensors are located on the side facing alignment beam projecting devices so as not to intercept the exposure light. However, such methods require complicated systems and high apparatus cost.

SUMMARY OF THE INVENTION

The present invention has been made in consideration of the above situation, and has as its object to solve the problems resulting from updating of the alignment marks.

According to the first aspect of the present invention, an exposure apparatus for aligning a wafer and mask, and transferring a pattern on the mask onto the wafer, comprises: a wafer stage for mounting a wafer formed with a first alignment mark; a mask holder for holding a mask formed with a second alignment mark at a position outside an exposure field angle; a detection unit for optically detecting a positional deviation between the first and second alignment marks; a calculation unit for calculating a positional deviation between a first pattern formed on the wafer and a second pattern formed on the mask on the basis of a detection result of the detection unit, a position of the first alignment mark in the wafer, and a position of the second alignment mark in the mask; and an actuator for adjusting a positional relationship between the wafer and mask on the basis of a calculation result of the calculation unit to make the first and second patterns overlap each other.

In the exposure apparatus according to the first aspect of the present invention, for example, the detection unit is preferably fixed at a position where the detection unit does not intercept exposure light upon transferring the second pattern onto the wafer.

In the exposure apparatus according to the first aspect of the present invention, for example, it is preferable that the first alignment mark include a first X-detection mark and first Y-detection mark, the second alignment mark include a second X-detection mark and second Y-detection mark, and the detection unit have an X-positional deviation detector for detecting a positional deviation between the first and second X-detection marks, and a Y-positional deviation detector for detecting a positional deviation between the first and second Y-detection marks.

The exposure apparatus according to the first aspect of the present invention preferably further comprises, for example, an aperture blade which is located between the mask held by the mask holder and the wafer stage, and defines the exposure field angle.

The exposure apparatus according to the first aspect of the present invention preferably further comprises, for example, a drive unit for changing a position of the aperture blade.

In the exposure apparatus according to the first aspect of the present invention, for example, it is preferable that the mask have a light-shielding portion around the second pattern, and the aperture blade intercept marginal rays of the exposure light to locate an outer peripheral portion of the exposure light within the light-shielding portion.

In the exposure apparatus according to the first aspect of the present invention, for example, the aperture blade preferably intercepts the exposure light, and transmits alignment light used by the detection unit to detect positions of the alignment marks.

In the exposure apparatus according to the first aspect of the present invention, for example, the aperture blade preferably has an aperture for transmitting alignment light used by the detection unit to detect positions of the alignment marks.

The exposure apparatus according to the first aspect of the present invention preferably further comprises, for example, a second aperture blade for preventing the exposure light from being transmitted through the aperture and hitting the wafer upon exposure.

In the exposure apparatus according to the first aspect of the present invention, for example, it is preferable that the mask have a light-shielding portion around the second pattern, and the second alignment mark be formed outside the second pattern.

The exposure apparatus according to the first aspect of the present invention preferably further comprises, for example, an exposure light source for emitting X-rays as the exposure light.

In the exposure apparatus according to the first aspect of the present invention, for example, while central axes of the first and second pattern agree with each other, the apparatus preferably satisfies:

$$Y1+Ym/2+Yc/2-L\cdot\tan(\theta) < Ya < Y2-Ym/2-Yc/2-L\cdot\tan(\theta)$$

where Ya is the distance from the central axis to a distal end of the aperture blade, L is the distance from the aperture blade to the mask, θ is a divergent angle of the exposure light at the distal end of the aperture blade, Yc is the half-shade blur amount of the exposure light on the mask under an influence of the aperture blade, Y1 is the distance from the central axis to the first alignment mark, Y2 is the distance from the central axis to a center of the second alignment mark, and Ym is a width of each of the first and second alignment marks.

According to the second aspect of the present invention, an exposure apparatus for aligning a wafer and mask, and transferring a pattern on the mask onto the wafer, comprises: a wafer stage for mounting a wafer formed with an alignment mark; a mask holder for holding a mask formed with an alignment light transmission portion at a position outside an exposure field angle; a detection unit for detecting a position of the alignment mark by irradiating the alignment mark with alignment light via the alignment light transmission portion; a calculation unit for calculating a positional deviation between a first pattern formed on the wafer and a second pattern formed on the mask on the basis of a detection result of the detection unit, a position of the alignment mark in the wafer, and a position of the alignment light transmission portion in the mask; and an actuator for adjusting a positional relationship between the wafer and mask on the basis of a calculation result of the calculation unit to make the first and second patterns overlap each other.

In the exposure apparatus according to the second aspect of the present invention, for example, the detection unit is preferably fixed at a position where the detection unit does not intercept exposure light upon transferring the second pattern onto the wafer.

In the exposure apparatus according to the second aspect of the present invention, for example, it is preferable that the alignment mark include an X-detection mark and a Y-detection mark, the alignment light transmission portion include an X-detection transmission portion and a Y-detection transmission portion, and the detection unit have an X-position detector for detecting a position of the X-detection mark by irradiating the X-detection mark with the alignment light via the X-detection transmission portion, and a Y-position detector for detecting a position of the Y-detection mark by irradiating the Y-detection mark with the alignment light via the Y-detection transmission portion.

The exposure apparatus according to the second aspect of the present invention preferably further comprises, for example, an aperture blade which is located between the mask held by the mask holder and the wafer stage, and defines the exposure field angle.

In the exposure apparatus according to the second aspect of the present invention, for example, it is preferable that the mask have a light-shielding portion around the second pattern, and the aperture blade intercept marginal rays of the exposure light to locate an outer peripheral portion of the exposure light within the light-shielding portion.

In the exposure apparatus according to the second aspect of the present invention, for example, it is preferable that the mask have a light-shielding portion around the second pattern, and the alignment light transmission portion be formed outside the second pattern.

The exposure apparatus according to the second aspect of the present invention preferably further comprises, for example, an exposure light source for emitting X-rays as the exposure light.

In the exposure apparatus according to the second aspect of the present invention, for example, while central axes of the first and second pattern agree with each other, the apparatus preferably satisfies:

$$Y1+Ym/2+Yc/2-L\cdot\tan(\theta) < Ya < Y2-Ym/2-Yc/2-L\cdot\tan(\theta)$$

where Ya is the distance from the central axis to a distal end of the aperture blade, L is the distance from the aperture blade to the mask, θ is a divergent angle of the exposure light at the distal end of the aperture blade, Yc is the half-shade blur amount of the exposure light on the mask under an influence of the aperture blade, Y1 is the distance from the central axis to the alignment mark, Y2 is the distance from the central axis to the alignment light transmission portion, and Ym is a width of each of the alignment mark and alignment light transmission portion.

According to the third aspect of the present invention, an exposure apparatus for aligning a wafer and mask, and transferring a pattern on the mask onto the wafer, comprises: a wafer stage for mounting a wafer formed with an alignment mark; a mask holder formed with an alignment light transmission portion; a detection unit for detecting a position of the alignment mark by irradiating the alignment mark with alignment light via the alignment light transmission portion; a calculation unit for calculating a positional deviation between a first pattern formed on the wafer and a second pattern formed on a mask on the basis of a detection result of the detection unit, a position of the alignment mark in the wafer, and a positional relationship between the alignment light transmission portion and the mask held by the mask holder; and an actuator for adjusting a positional relationship between the wafer and mask on the basis of a calculation result of the calculation unit to make the first and second patterns overlap each other.

In the exposure apparatus according to the third aspect of the present invention, for example, the detection unit is preferably fixed at a position where the detection unit does not intercept exposure light upon transferring the second pattern onto the wafer.

In the exposure apparatus according to the third aspect of the present invention, for example, it is preferable that the alignment mark include an X-detection mark and a Y-detection mark, the alignment light transmission portion include an X-detection transmission portion and a Y-detection transmission portion, and the detection unit have an X-position detector for detecting a position of the X-detection mark by irradiating the X-detection mark with the alignment light via the X-detection transmission portion, and a Y-position detector for detecting a position of the Y-detection mark by irradiating the Y-detection mark with the alignment light via the Y-detection transmission portion.

The exposure apparatus according to the third aspect of the present invention preferably further comprises, for example, an aperture blade which is located between the mask held by the mask holder and the wafer stage, and defines the exposure field angle.

In the exposure apparatus according to the third aspect of the present invention, for example, it is preferable that the mask have a light-shielding portion around the second pattern, and the aperture blade intercept marginal rays of the exposure light to make an outer peripheral portion of the exposure light locate within the light-shielding portion.

The exposure apparatus according to the third aspect of the present invention preferably further comprises, for example, an exposure light source for emitting X-rays as the exposure light.

In the exposure apparatus according to the third aspect of the present invention, for example, while central axes of the first and second pattern agree with each other, the apparatus preferably satisfies:

$$Y1+Ym/2+Yc/2-L\cdot\tan(\theta) < Ya < Y2-Ym/2-Yc/2-L\cdot\tan(\theta)$$

where Ya is the distance from the central axis to a distal end of the aperture blade, L is the distance from the aperture blade to the mask, θ is a divergent angle of the exposure light at the distal end of the aperture blade, Yc is the half-shade blur amount of the exposure light on the mask under an influence of the aperture blade, Y1 is the distance from the central axis to the alignment mark, Y2 is the distance from the central axis to the alignment light transmission portion, and Ym is a width of each of the alignment mark and alignment light transmission portion.

According to the fourth aspect of the present invention, an exposure method for aligning a wafer and mask, and transferring a pattern on the mask onto the wafer, comprises: the detection step of optically detecting a positional deviation between a first alignment mark formed on a wafer and a second alignment mark formed on a mask outside an exposure field angle; the calculation step of calculating a positional deviation between a first pattern formed on the wafer and a second pattern formed on the mask on the basis of a detection result in the detection step, a position of the first alignment mark in the wafer, and a position of the second alignment mark in the mask; and the adjustment step of adjusting a positional relationship between the wafer and mask on the basis of a calculation result in the calculation step to make the first and second patterns overlap each other.

According to the fifth aspect of the present invention, an exposure method for aligning a wafer and mask, and transferring a pattern on the mask onto the wafer, comprises: the detection step of detecting a position of an alignment mark formed on a wafer by irradiating the alignment mark with alignment light via an alignment light transmission portion formed on a mask outside an exposure field angle; the calculation step of calculating a positional deviation between a first pattern formed on the wafer and a second pattern formed on the mask on the basis of a detection result in the detection step, a position of the alignment mark in the wafer, and a position of the alignment light transmission portion in the mask; and the adjustment step of adjusting a positional relationship between the wafer and mask on the basis of a calculation result in the calculation step to make the first and second patterns overlap each other.

According to the sixth aspect of the present invention, an exposure method for aligning a wafer and mask, and transferring a pattern on the mask onto the wafer, comprises: the detection step of detecting a position of the alignment mark by irradiating an alignment mark formed on a wafer with alignment light via an alignment light transmission portion formed on a mask holder; the calculation step of calculating a positional deviation between a first pattern formed on the wafer and a second pattern formed on a mask on the basis of a detection result in the detection step, a position of the alignment mark in the wafer, and a positional relationship between the alignment light transmission portion and the mask held by the mask holder; and the adjustment step of adjusting a positional relationship between the wafer and mask on the basis of a calculation result in the calculation step to make the first and second patterns overlap each other.

According to the seventh aspect of the present invention, an exposure method for transferring patterns for a plurality of chips by a single exposure, comprises: (a) the first lithography step including the first exposure step of transferring, from a first mask on which first patterns for a plurality of chips are formed to sandwich a scribe line therebetween, and a first alignment mark is formed on a scribe line between neighboring chips, the first pattern and first alignment mark onto a wafer; and (b) the second lithography step including the alignment step of aligning a second mask on which second patterns for a plurality of chips are formed to sandwich a scribe line therebetween, and a second alignment mark is formed outside an exposure field angle, to the wafer using the second alignment mark and the first alignment mark formed on the wafer in the first lithography step, and the second exposure step of transferring the second patterns from the second mask onto the wafer.

In the exposure method according to the seventh aspect of the present invention, for example, it is preferable that the first and second exposure steps include the step of performing exposure for a plurality of shots, and preventing multiple-exposure between neighboring shots by an aperture blade located between an exposure light source and the mask during the exposure.

One preferred embodiment of the present invention is characterized by solving the above-mentioned problems by setting a predetermined relationship among the layout of marks associated with alignment, the positional relationship of objects to be subjected to alignment measurement, and the layout of an alignment detection system itself.

In this exposure method, a first pattern and first alignment marks (each having a width Ym in the direction normal to the scribe line) for positional deviation measurement located around the first pattern are formed on a wafer as an object to be exposed. On the other hand, a second pattern, and second alignment marks (each similarly having a width Ym in the direction normal to the scribe line) for positional deviation measurement, which are located around the second pattern and including exposure light transmission portions, are formed on a mask as an object to be transferred.

According to the present invention, an exposure method of measuring the positional deviation between the first and second alignment marks on such a mask and wafer using an alignment detection system, and transferring the second pattern on the mask onto the first pattern on the wafer by exposure, comprises the step of calculating an X-positional deviation xm by shifting a wafer stage by Yb upon positional deviation measurement using a mask which is set to satisfy:

$$Y2=Y1+Yp+Yb \ (Yb>0)$$

where Y1 is the distance from the center of the first pattern on the wafer to the first alignment mark in the direction normal to the scribe line, and Y2 is the distance from the center of the first pattern on the mask to the second alignment mark in the direction normal to the scribe line. Note that Yp is the distance from the first alignment mark to the second alignment mark in the direction normal to the scribe line, and takes a positive value in a direction outside the field angle.

Also, a blade is set so that its parameters fall within the range:

$$Y1+Ym/2+Yc/2-L \tan (\theta)<Ya<Y2-Ym/2-Yc/2-L \tan (\theta)$$

where Ya is the distance from the center of the first pattern to the distal end of the blade, L is the distance from the blade to the mask surface, θ is the divergent angle of exposure light at the blade distal end, and Yc is the half-shade blur amount of the blade on the mask surface. As described above, Ym is the width of an X-alignment mark.

Similar position deviation detection and blade setup are done in the Y-direction to obtain a deviation ym.

By reflecting the deviations xm and ym between the first and second alignment marks, which are measured using the above-mentioned relationship between the marks and blade used in alignment, into the drive amounts of a wafer stage, the need for updating the alignment marks on the wafer upon every exposure even when it is not actually necessary can be obviated.

An exposure apparatus according to another embodiment of the present invention uses a wafer as an object to be exposed, on which a first pattern and first alignment marks (each having a width Ym in the direction normal to the field angle) for positional deviation measurement, which are located around the first pattern, are formed, and a mask as an object to be transferred, on which a second pattern and second alignment marks (each similarly having a width Ym in the direction normal to the field angle), which are located around the second pattern and have exposure light transmission portions, are formed.

In this embodiment, an exposure apparatus for measuring the positional deviation between the first and second alignment marks on such a mask and wafer using an alignment detection system, and transferring the second pattern on the mask onto the first pattern on the wafer by exposure, calculates an X-positional deviation xm by driving a wafer stage to a position shifted by Yb upon positional deviation measurement using a mask which is set to satisfy:

$$Y2=Y1+Yp+Yb \ (Yb>0)$$

where Y1 is the distance from the center of the first pattern on the wafer to the first alignment mark in the direction normal to the scribe line, and Y2 is the distance from the center of the first pattern on the mask to the second alignment mark in the direction normal to the scribe line. Note that Yp is the distance from the first alignment mark to the second alignment mark in the direction normal to the scribe line, and takes a positive value in a direction outside the field angle.

The exposure apparatus comprises an exposure light source, an alignment detection system, a mask stage, and wafer stage, and has a blade for defining an exposure field angle and also preventing unnecessary exposure onto the alignment marks on the wafer.

The blade is set so that its parameters fall within the range:

$$Y1+Ym/2+Yc/2-L \tan (\theta)<Ya<Y2-Ym/2-Yc/2-L \tan (\theta)$$

where Ya is the distance from the center of the first pattern to the distal end of the blade, L is the distance from the blade to the mask surface, θ is the divergent angle of exposure light at the blade distal end, and Yc is the half-shade blur amount of the blade on the mask surface. By satisfying the above inequality, the alignment marks on the wafer can be prevented from being unnecessarily exposed, and the need for updating the alignment marks in units of processes can be obviated.

Similar position deviation detection and blade setup are done in the Y-direction to obtain a deviation ym.

An exposure apparatus according to a preferred embodiment of the present invention uses a layout in which the alignment detection system does not intercept exposure light even upon exposure. Hence, the alignment detection system need not be driven between alignment and exposure, thus improving the throughput. In this exposure apparatus, the alignment detection system itself and, hence, the position of the alignment detection system can be fixed with respect to the exposure apparatus, thus realizing a simple, low-cos t exposure apparatus.

Further objects, features and advantages of the present invention will become apparent from the following detailed description of embodiments of the present invention with reference to the accompanying drawings.

BRIEF DESCRIPTION OF THE DRAWINGS

FIG. 2 is an explanatory view of the principle of positional deviation detection;

FIGS. 13A and 13B are plan views showing the pattern layout on a mask according to the fourth embodiment of the present invention;

FIGS. 17A and 17B are plan views showing the conventional problems.

DETAILED DESCRIPTION OF THE PREFERRED EMBODIMENTS

Figure 1:
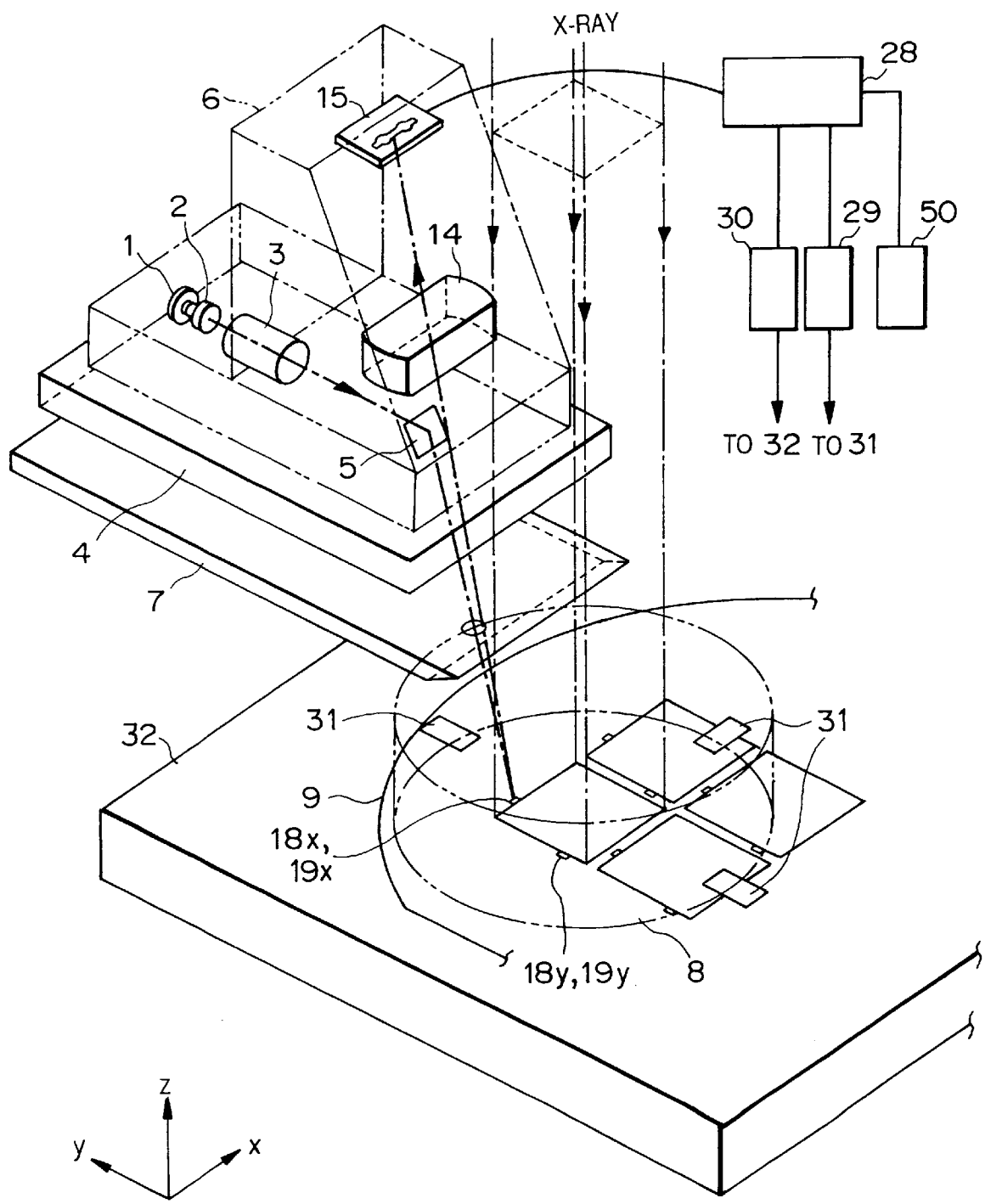
FIG. 1 is a perspective view showing an alignment device for a semiconductor exposure apparatus according to the first embodiment of the present invention.

FIG. 1 is a schematic view of an optical system according to the first embodiment of the present invention, which is applied to a relative alignment device between a mask and wafer, which device is equipped in an X-ray exposure apparatus. Referring to FIG. 1, a light beam of a wavelength $\lambda 1$ emitted by a light source 1 such as an LD or the like is converted into a collimated light beam by a collimator lens 2. The collimated light beam is transmitted through a projection lens 3, is deflected by a mirror 5, and then hits physical optical elements 18x and 19x as alignment marks for horizontal deviation detection, which are respectively formed on a mask 8 and wafer 9. The beam spot size on the mask 8 is set to be larger by several 10 $\mu$m than the size of the alignment mark 18x by the projection lens 3. Diffracted light coming from each physical optical element contains information indicating the horizontal deviation between the mask 8 and wafer 9, and forms an image on the light-receiving surface of a photodetector 15 via a light-receiving lens 14.

An alignment detection system 6 is constructed as a unit, and is mounted on a stage 4, which can be driven in the X- and Y-directions. Reference numeral 7 denotes aperture blades which absorb X-rays as exposure light so as not to irradiate the wafer with the exposure light. FIG. 1 illustrates only the alignment marks 18x and 19x used for detecting the positional deviation in the X-direction, and a corresponding optical pickup 6. Also, in the Y-direction, an optical pickup (not shown) corresponding to alignment marks 18y and 19y is located at a 90° rotated position of the optical pickup 6 to contact the other side of the exposure field angle. X- and Y-shift components and chip rotation (relative positional deviation) are calculated by a calculator 28 on the basis of two positional deviation detection signals. The calculator 28 determines the moving amounts of a mask holder 31 and wafer stage 32 on the basis of the calculated relative positional deviation, and sends drive signals to actuators 29 and 30. The aperture blades 7 are equipped in correspondence with the four sides of the exposure field angle, and are aligned by a driver (not shown) in accordance with the field angle.

FIG. 2 is an explanatory view of the principle of the relative alignment method between the mask 8 and wafer 9 using physical optical elements. In this embodiment, reflection and refraction take place on the wafer in practice, but FIG. 2 illustrates a transmission diffraction optical system equivalent to this embodiment. Referring to FIG. 2, physical optical elements 16a and 17a are respectively placed on the mask 8, and physical optical elements 16b and 17b are placed on the wafer 9. The mask 8 and wafer 9 have a spacing g. Assume that the focal lengths of the physical optical elements are fmpl, fmnl, fwnl, and fwpl.

When the two physical optical elements 16a and 17a on the mask 8 are irradiated with light of a wavelength $\lambda 1$ as a collimated light beam, the light beam that has undergone the lens effect by the physical optical element 16a is focused on a plane S which is spaced by L from the wafer 9 and is conjugate with the light-receiving surface of the photodetector 15 for lens 14, by the physical optical element 16b inserted at a position opposing the element 16a. Similarly, the light beam that has undergone the lens effect by the physical optical element 17a is focused on the plane S which is spaced by L from the wafer 9 and is conjugate with the light-receiving surface of the photodetector 15 for lens 14, by the physical optical element 17b inserted at a position opposing the element 17a.

An x-deviation between the mask 8 and wafer 9 corresponds to a change in optical layouts of the physical optical elements on the mask and those on the wafer. When a deviation has occurred, the position of the spot formed by a combination of the physical optical elements 16a and 16b of those formed on the light-receiving surface of the photodetector 15 moves by:

$$S1 = \{1 - L/(fmpl - g)\} \cdot \_ \quad (1)$$

Also, the position of the spot formed by a combination of the physical optical elements 17a and 17b moves by:

$$S2 = \{1 - L/(fmnl - g)\} \cdot \_ \quad (2)$$

Assuming that fmpl=230 $\mu$m, fmnl=−230 $\mu$m, g=30 $\mu$m, and L=20 mm, we have:

$$S1 = -99\_, \quad S2 = 77.9\_$$

Upon the relative positional deviation between the mask 8 and wafer 9, the change in spacing between the two spots is enlarged 176.9-fold on the light-receiving surface of the photodetector 15. Hence, by detecting the change in spacing between the spots, the relative positional deviation between the mask 8 and wafer 9 can be precisely detected. The focal lengths fwnl and fwpl of zone plates on the wafer side, which are used for focusing light on the photodetector 15, are determined based on an imaging formula by:

$$1/L = 1/(fmpl - g) + 1/fwnl \quad (3)$$

$$1/L = 1/(fmnl - g) + 1/fwnl \quad (4)$$

In this embodiment, from equations (3) and (4), we have:

$$fwnl = -202 \, \mu m, \quad fwpl = 256.7 \, \mu m.$$

Figure 3A:
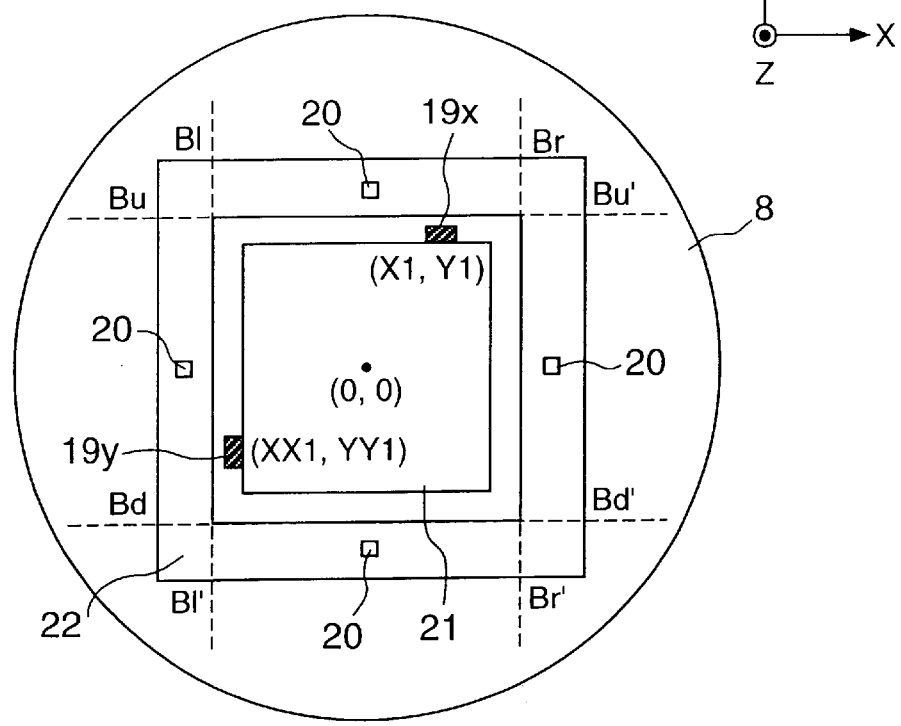
FIGS. 3A and 3B are plan views showing the pattern layout on a mask in the first embodiment.
Figure 3B:
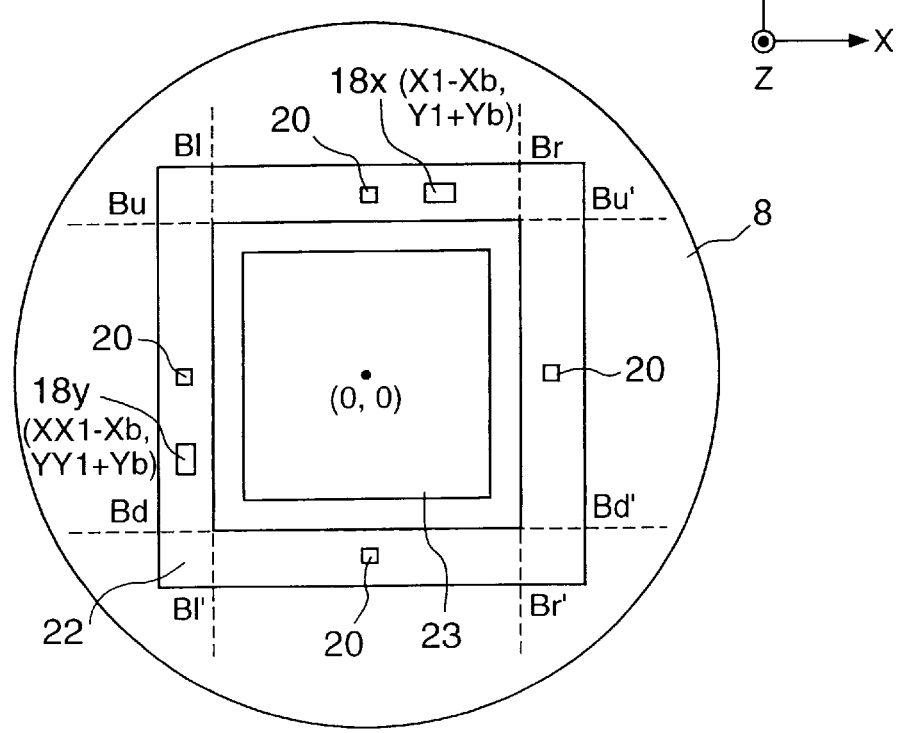

FIGS. 3A and 3B show the pattern layout in masks used in this embodiment. FIG. 3A shows a first exposure mask. On the membrane of the mask, an IC pattern 21, alignment marks 20, X-deviation measurement wafer-side alignment mark 19x, Y-deviation measurement wafer-side alignment mark 19y, and exposure light non-transmission portion 22 are formed. FIG. 3B shows a second exposure mask, which is to be superposed on the wafer pattern formed by exposure using the first exposure mask. On the membrane of the mask, an IC pattern 23, mask alignment marks 20, X-deviation measurement mask-side alignment mark 18x, Y-deviation measurement mask-side alignment mark 18y, and exposure light non-transmission portion 22 are formed.

The mask alignment marks 20 are used for adjusting any offset amount between the mask and the origin of the wafer stage, and the rotation amount of the mask upon the wafer stage. As for X-deviation detection marks, if the wafer x-mark 19x shown in FIG. 3A has a coordinate position (X1, Y1), the mask x-mark 18x shown in FIG. 3B is located at a coordinate position (X1−Xb, Y1+Yb) outside the field angle. Likewise, as for Y-deviation detection marks, if the wafer y-mark 19y shown in FIG. 3A has a coordinate position (XX1, YY1), the mask y-mark 18y shown in FIG. 3B is located at a coordinate position (XX1−Xb, YY1+Yb) outside the field angle. Note that Xb and Yb satisfy:

Xb, Yb>0

As a numerical example, they are set at:

Xb=Yb=200 μm.

Note that lines BuBu', BdBd', BlBl', and BrBr' in FIGS. 3A and 3B indicate the positions of images of the respective edges of the four aperture blades 7 on the mask surface. In the following description, only one aperture blade 7 will be explained, but the same applies to the remaining three aperture blades.

Figure 4A:
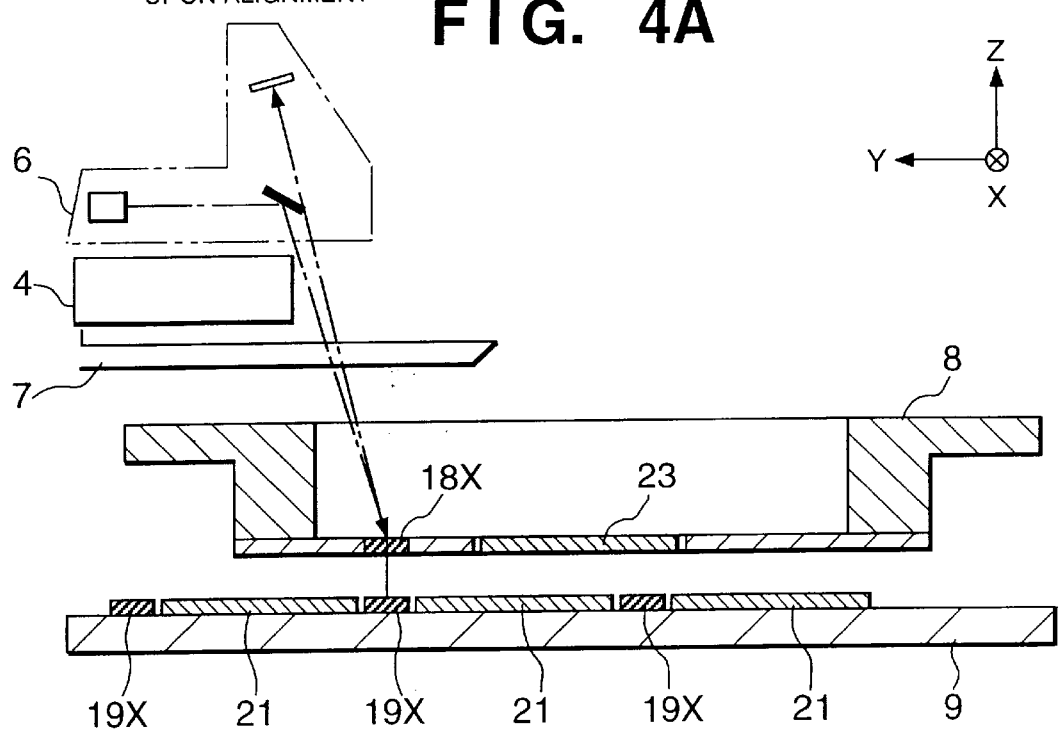
FIGS. 4A and 4B show the states of the device upon alignment and exposure in the first embodiment.
Figure 4B:
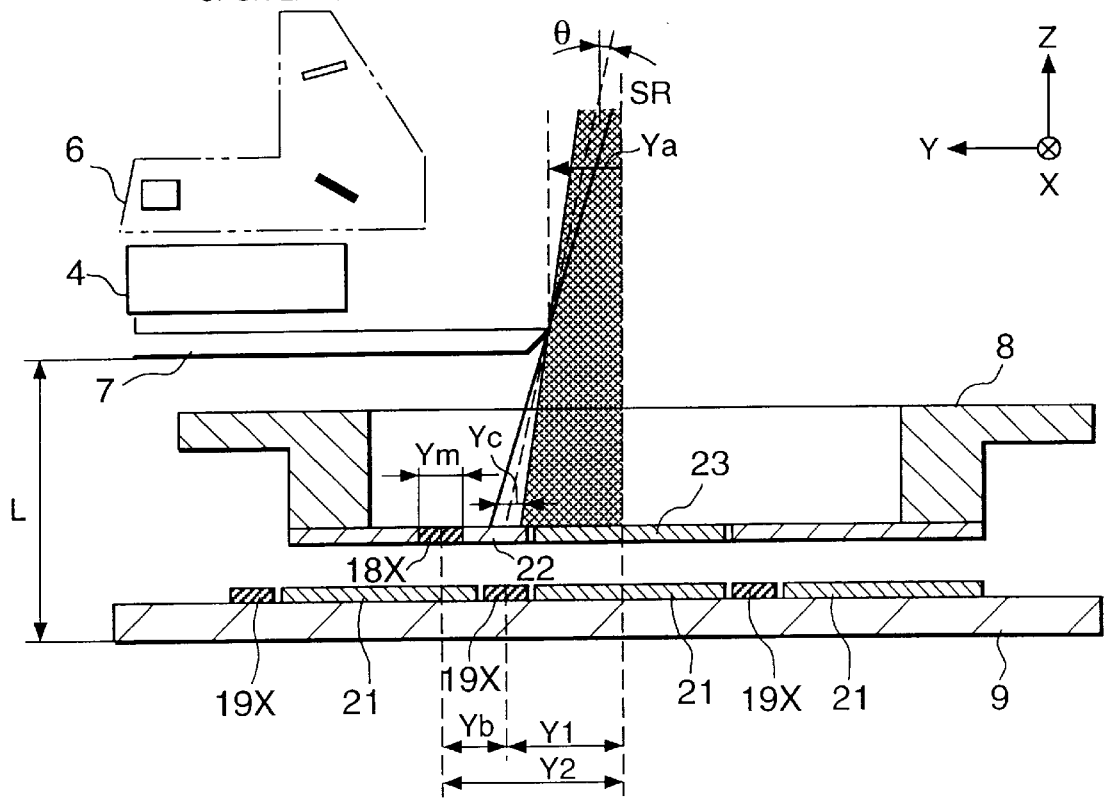

FIGS. 4A and 4B are explanatory views of alignment and exposure using the masks shown in FIGS. 3A and 3B. FIG. 4A shows an X-direction section during measurement of the X-deviation of a predetermined shot upon alignment. The circuit patterns 21 and alignment marks 19x are formed on the wafer 9 at predetermined spacings using the first exposure mask shown in FIG. 3A, and the surface of the wafer is covered by a resist (not shown).

Positional deviation (alignment) measurement is done by the alignment detection system 6 while the wafer 9 faces the mask 8. Upon alignment measurement, the mask 8 and wafer 9 are located at a position where the mask-side alignment mark 18x and wafer-side alignment mark 19x overlap each other in design. This position has offsets corresponding to shift amounts (−Xb, Yb) on the mask from the state wherein the IC patterns 21 and 23 on the mask and wafer overlap each other. The wafer stage 32 is aligned to this position. In this embodiment, since the absolute values of the offsets are equal to each other:

Xb=Yb=200 μm.

When the alignment marks 18x and 19x overlap each other, the alignment marks 18y and 19y used for detecting the Y-deviation also overlap each other at the same time. Therefore, using a Y-alignment detection system (not shown) having the same arrangement as that of the X-alignment detection system 6, the X- and Y-deviations can be observed at the same time. Such a layout is also advantageous for obtaining high throughput. However, even when the X- and Y-marks have different offsets due to limitations on the mark layout, the wafer stage 32 need only be driven to measure positional deviation upon measurement of each mark. Since a sufficiently small offset amount (normally, 100 to 1,000 μm) need only be given, even when a variation in magnification of the interferometer of the wafer stage 32 is around 1 ppm, its influence is 1 nm or less, which is negligible.

In FIGS. 4A and 4B, reference numeral 7 denotes aperture blades, which are located between the alignment detection system and mask to absorb exposure light and transmit alignment light.

In such a positional relationship given with offsets, pre-exposure positional deviation measurement is done for a sample shot (1) in the case of global alignment, or in units of shots (2) in the case of die-by-die alignment. Assume that the positional deviation measurement values obtained at that time are (xm, ym).

FIG. 4B shows the state upon exposure. After the positional deviation values are obtained by the measurement in FIG. 4A, the wafer stage 32 is driven in a direction to correct the detected positional deviation values (xm, ym), and exposure is then made. At this time, the offsets (−Xb, Yb) given upon alignment measurement are not reflected (the offsets are set at "0").

FIG. 4B also shows the exposure area defined by the aperture blades 7. An SR light used in exposure is not an ideal point light source but has a predetermined size. As a result, as shown in FIG. 4B, the shade of the aperture blades 7 does not form a sharp image but forms a half-shade blur having a size around 10 μm on the wafer. In such a case, when the aperture blades 7 are aligned so that the half-shade blur area formed by the blades 7 falls within the absorption area 22 of the mask 8, the influence of the half-shade blur on the wafer can be avoided.

The mask-side alignment marks 18x and 18y and mask alignment marks 20 are set at positions which are not irradiated with the exposure light, since it is intercepted by the aperture blades 7. For this reason, the marks 18x, 18y, and 20 are not transferred onto the wafer, and do not influence the wafer-side alignment marks 19x and 19y. The position of each blade 7 in FIG. 4B is set to fall within:

$$Y1+Ym/2+Yc/2-L\tan(\theta) < Ya < Y2-Ym/2-Yc/2-L\tan(\theta) \quad (5)$$

where Ya is the distance from the center of the first pattern 23 to the distal end of the blade 7, L is the distance from the blade 7 to the mask surface, θ is the divergent angle of the exposure light at the distal end of the blade 7, Yc is the half-shade blur amount on the mask surface by the blade 7, Y1 is the distance from the center of the first pattern 23 to that of the wafer-side alignment mark 19x, Y2 is the distance from the center of the first pattern 23 to that of the mask-side alignment mark 18x, and Ym is the width of each of the marks 18x and 19x in the direction normal to the scribe line.

FIG. 4B illustrates the width Ym of the alignment mark 18x in the direction normal to the scribe line. In this exposure apparatus, the calculator 28 calculates the position of each aperture blade 7 to meet the condition given by inequality (5) on the basis of input values Y1, Y2, and Ym. A drive unit 50 sets the position of each aperture blade 7 on the basis of this calculation result.

In this embodiment, as shown in FIG. 4A, since the distance from the mask-side alignment mark 18x to the IC pattern 23 on the mask 8 is larger than the alignment beam spot size, the influence of scattered noise from the IC pattern 23 on the mask 8 can be reduced. Furthermore, since the IC pattern 21 on the wafer 9 is not irradiated with the alignment beam due to the effect of the exposure light absorption area 22, the influence of scattered noise from the pattern 21 can also be reduced.

Figure 5:
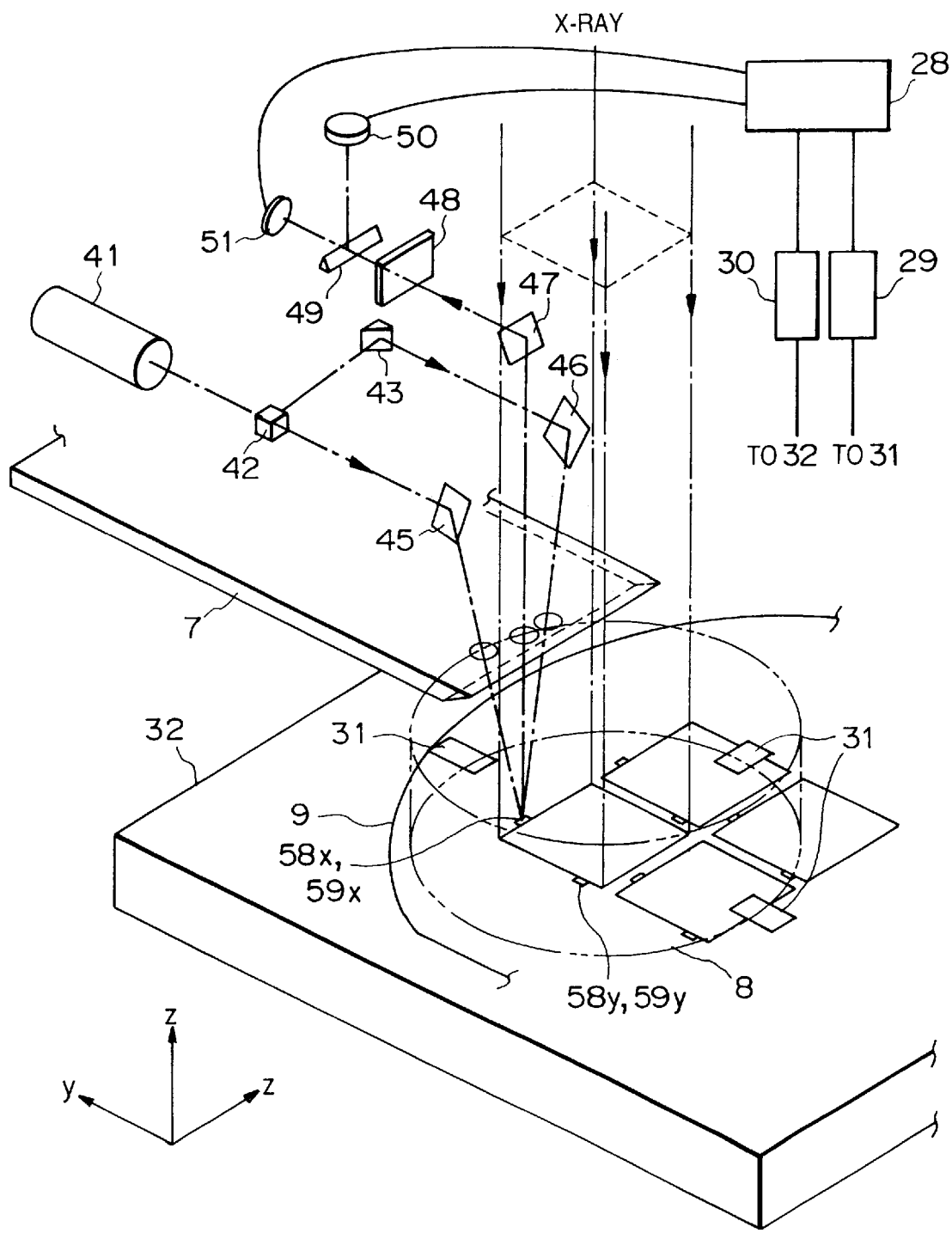
FIG. 5 is a perspective view showing an alignment device for a semiconductor exposure apparatus according to the second embodiment of the present invention.

FIG. 5 shows the second embodiment of the present invention, i.e., is a schematic perspective view of an optical system in which the present invention is applied to a relative alignment device between a mask and wafer for an X-ray proximity exposure apparatus. Light of a frequency f1 as p-polarized light emitted by a two-frequency laser 41 is transmitted through a polarization beam splitter 42, and is deflected by a mirror 45. The deflected light is transmitted through aperture blades 7, and is then incident on an alignment mark 58x on a mask 8 and an alignment mark 59x on a wafer 9. The alignment marks 58x and 59x are diffraction grating marks obtained by forming grating lines in the Y-direction.

On the other hand, light of a frequency f2 as s-polarized light emitted by the two-frequency laser 41 is reflected by the polarization beam splitter 42, and is deflected by a mirror 46. The deflected light is transmitted through the aperture blades 7, and is similarly incident on the alignment mark 58x on the mask and the alignment mark 59x on the wafer.

Figure 6A:
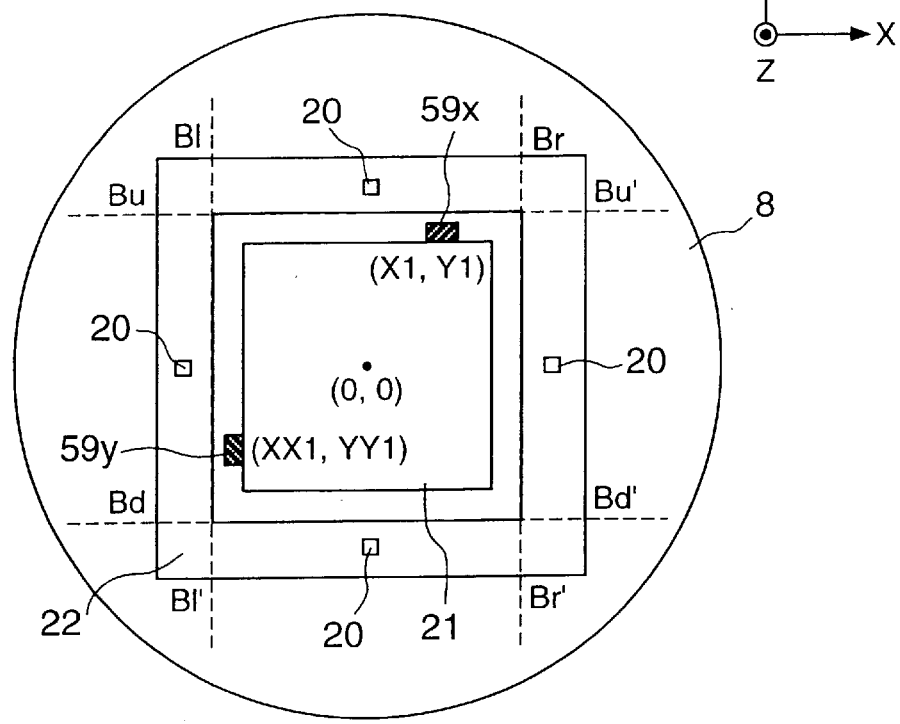
FIGS. 6A and 6B are plan views showing the pattern layout on a mask in the second embodiment.
Figure 6B:
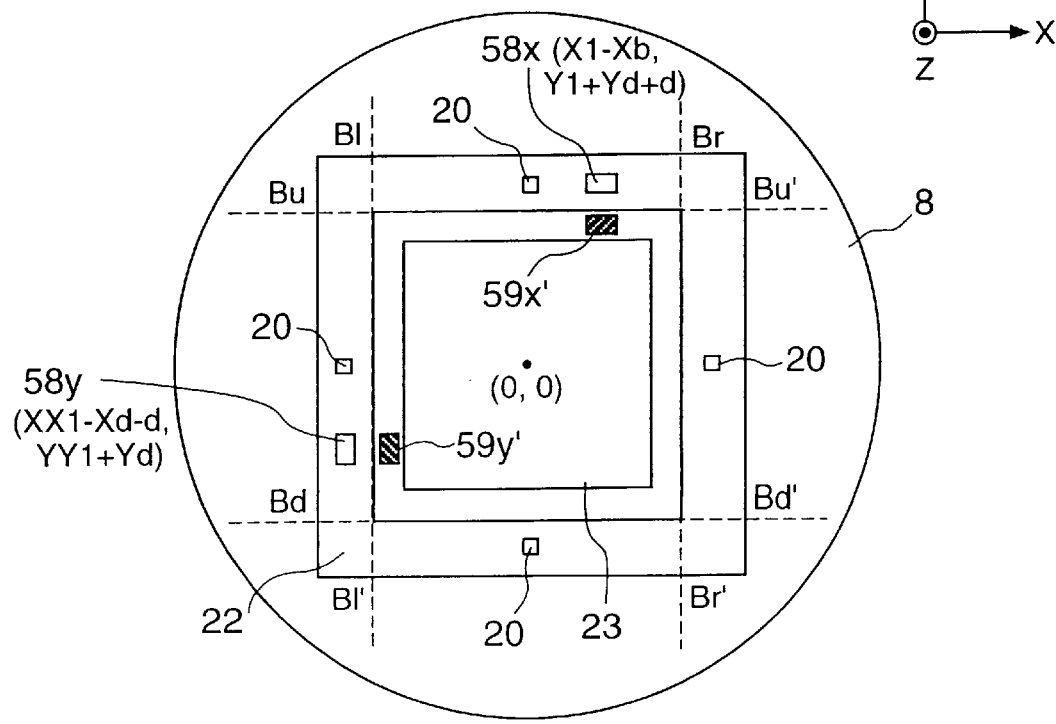
Figure 7A:
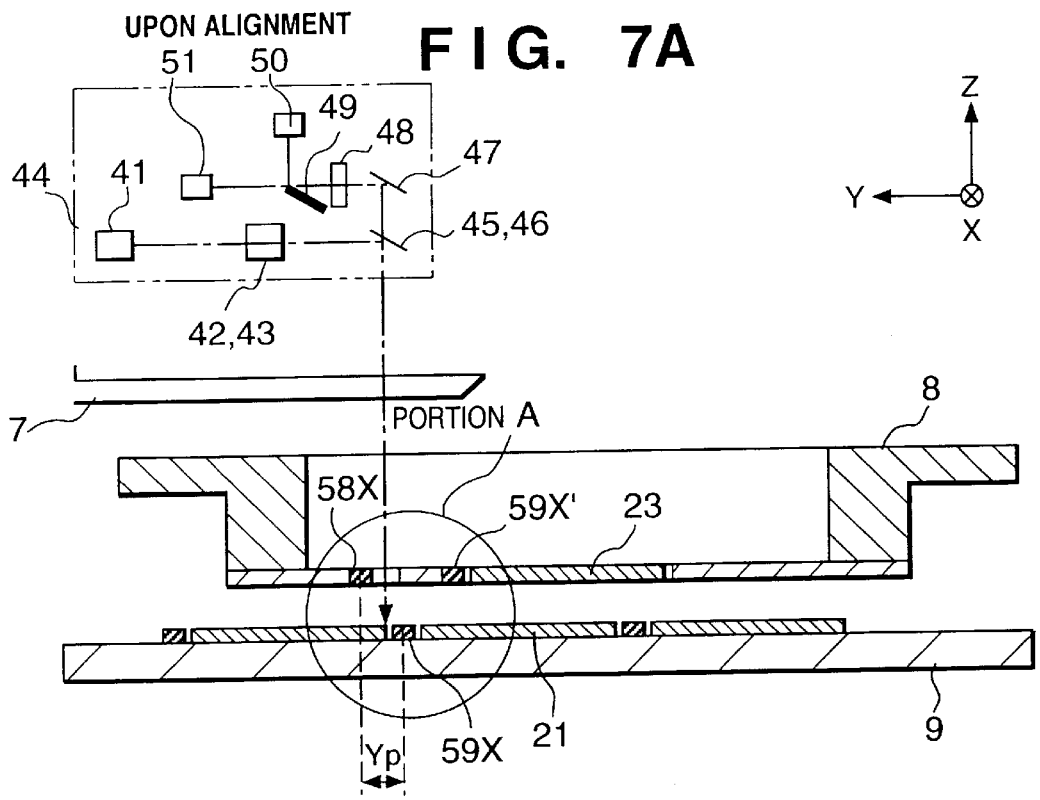
FIGS. 7A and 7B show the states of the device upon alignment and exposure in the second embodiment.
Figure 7B:
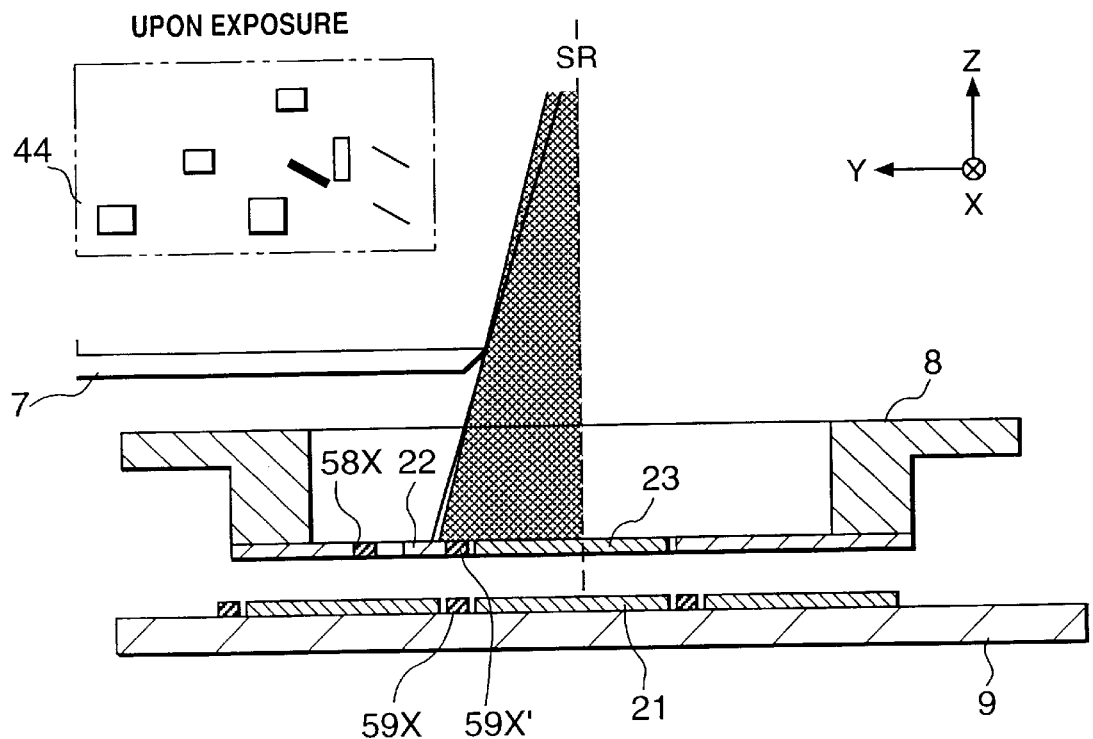

The alignment mark 58x on the mask 8 and the alignment mark 59x on the wafer 9 are spaced by Yd, as shown in FIG. 6B, and the mask portion above the mark 59x has an alignment light transmission portion, as shown in FIGS. 7A and 7B. The angles of the mirrors 45 and 46 and the pitches of the diffraction gratings are designed, so that the light beams of the frequencies f1 and f2 travel in the X-Z plane, and +1st-order light of the light of the frequency f1 and −1st-order light of the light of the frequency f2, which are diffracted by the diffraction grating alignment marks 58x and 59x, travel in the vertical direction (Z-direction). The diffracted light beams from the diffraction grating marks 58x and 59x enter a polarization plate 48 to adjust their directions of polarization. After that, the diffracted light beams from the diffraction grating marks 58x and 59x are split by an edge mirror 49. That is, the diffracted light from the diffraction grating mark 59x, which is not reflected by the edge mirror 49, travels straight, and is received by a photodetector 51. On the other hand, the diffracted light from the diffraction grating mark 58x is reflected by the edge mirror 49, and is received by a photodetector 50.

A change I1 in intensity of an electrical signal detected by the photodetector 50 is given by:

$$I1 = A + B \times \cos\{2\pi(f1-f2)t + 4\pi xm/p\} \quad (6)$$

where A is a constant representing the DC component, and B is a constant representing the amplitude of the AC component. Also, t is time, p is the pitch of the diffraction grating mark 58x, and xm is the deviation of the diffraction grating mark 58x in the X-direction.

On the other hand, a change I2 in intensity of an electrical signal detected by the photodetector 51 is given by:

$$I2 = A' + B' \times \cos\{2\pi(f1-f2)t + 4\pi xw/p\} \quad (7)$$

where A' is a constant representing the DC component, and B' is a constant representing the amplitude of the AC component. Again, t is time, p is the pitch of the diffraction grating mark 59x, and xw is the deviation of the diffraction grating mark 59x in the X-direction.

Signals detected by the photodetectors 50 and 51 are beat signals having a frequency (f1−f2), and the phase difference φ between the electrical signals I1 and I2 is given by:

$$\phi = 4\pi(xm - xw)/p \quad (8)$$

By measuring the phase difference φ by equation (8), the relative deviation (xm−xw) between the diffraction grating marks 58x and 59x in the X-direction, i.e., the positional deviation of the wafer 9 with respect to the mask 8 in the X-direction, can be calculated.

In this embodiment, a detection system is constructed as a unit. The aperture blades 7 located between the alignment detection system and mask absorb X-rays as exposure light so as not to irradiate the wafer with the exposure light.

FIG. 5 schematically illustrates only the alignment marks 58x and 59x used for detecting the positional deviation in the X-direction, and a corresponding optical pickup 6. Also, in the Y-direction, alignment marks 58y and 59y and a corresponding optical pickup (not shown) are located at 90°-rotated positions of the optical pickup 6 to contact the other side of the exposure field angle. X- and Y-shift components and chip rotation (relative positional deviation) are processed by a calculator 28 on the basis of two positional deviation detection signals. The calculator 28 determines the moving amounts of a mask holder 31 and wafer stage 32 on the basis of the calculated relative positional deviation, and sends drive signals to actuators 29 and 30. The aperture blades 7 are equipped in correspondence with the four sides of the exposure field angle, and are aligned by a driver (not shown) in accordance with the field angle.

FIGS. 6A and 6B show the pattern layout in masks used in this embodiment. FIG. 6A shows a first exposure mask. On the membrane of the mask, an IC pattern 21, alignment marks 20, X-deviation measurement wafer-side alignment mark 59x, Y-deviation measurement wafer-side alignment mark 59y, and an exposure light non-transmission portion 22 are formed. FIG. 6B shows a second exposure mask, which is to be superposed on the wafer pattern formed by exposure using the first exposure mask. On the membrane of the mask, an IC pattern 23, mask alignment marks 20, X-deviation measurement mask-side alignment mark 58x, Y-deviation measurement mask-side alignment mark 58y, wafer-side alignment marks 59x' and 59y' used for the next layer, and an exposure light non-transmission portion 22 are formed.

The mask alignment marks 20 are used for adjusting the offset amount between the mask and the origin of the wafer stage, and the rotation amount of the mask upon the wafer stage. As for X-deviation detection marks, if the wafer x-mark 59x shown in FIG. 6A has a coordinate position (X1, Y1), the mask x-mark 58x shown in FIG. 6B is located at a coordinate position (X1−Xb, Y1+Yb+d) outside the field angle. Similarly, as for Y-deviation detection marks, if the wafer y-mark 59y shown in FIG. 6A has a coordinate position (XX1, YY1), the mask y-mark 58y shown in FIG. 6B is located at a coordinate position (XX1−Xb−d, YY1+Yb) outside the field angle. Note that each diffraction grating has a size of 100×200 $\mu m^2$, and:

$$Xb = Yd = 50 \ \mu m, \ Xd = Yb = 1,500 \ \mu m.$$

Note that lines BuBu', BdBd', BlBl', and BrBr' in FIGS. 6A and 6B indicate the positions of images of the respective edges of the four aperture blades 7 on the mask surface.

FIGS. 7A and 7B and FIGS. 8A to 8C are explanatory views of alignment and exposure using the masks shown in FIGS. 6A and 6B. FIG. 7A shows an X-direction section during measurement of the X-deviation of a predetermined shot upon alignment. The circuit patterns 21 and alignment marks 59x are formed on the wafer 9 at predetermined spacings using the first exposure mask shown in FIG. 6A, and the surface of the wafer is covered by a resist (not shown).

Figure 8A:
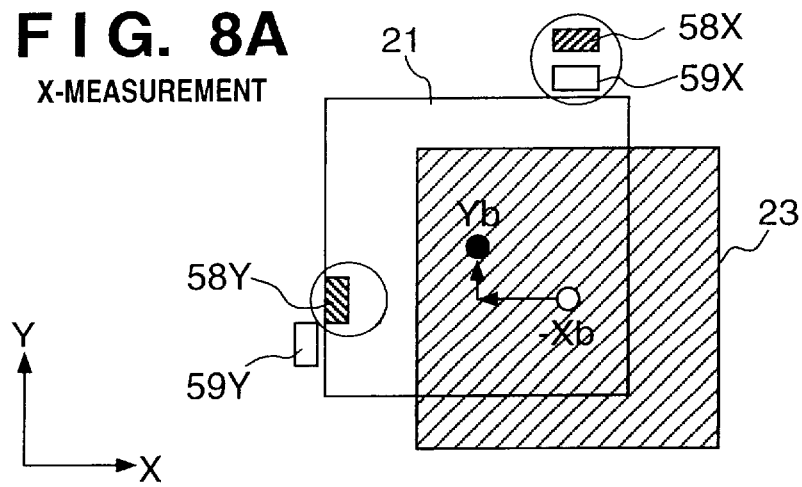
FIGS. 8A to 8C show the states of the device upon X- and Y-measurements and exposure in the second embodiment.

Positional deviation is measured by an alignment detection system 44 while the wafer 9 opposes the mask 8. Upon alignment measurement in the X-direction, the mask 8 and wafer 9 are located at a position where the mask-side alignment mark 58x and wafer-side alignment mark 59x have a predetermined spacing d in the Y-direction. This position has offsets corresponding to shift amounts (−Xb, Yb) on the mask from the state wherein the IC patterns 21 and 23 on the mask and wafer overlap each other, as shown in FIG. 8A. The wafer stage 32 is aligned to this position upon measurement in the X-direction.

Figure 8B:
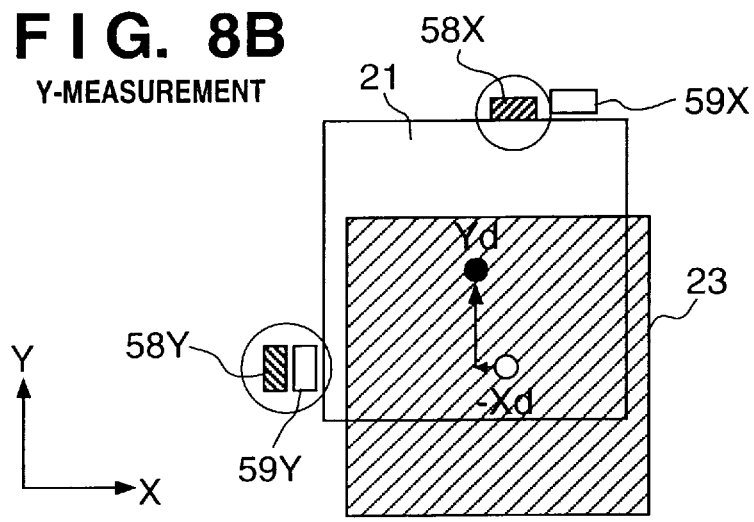

Likewise, upon alignment measurement in the Y-direction, the mask 8 and wafer 9 are set at a position where the mask-side alignment mark 58y and wafer-side alignment mark 59y have a predetermined spacing d in the X-direction. This position has offsets corresponding to shift amounts (−Xd, Yd) on the mask from the state wherein the IC patterns 21 and 23 on the mask and wafer overlap each other, as shown in FIG. 8B. The wafer stage 32 is aligned to this position upon measurement in the Y-direction.

In FIG. 5, reference numeral 7 denotes aperture blades, which are located between the alignment detection system and mask to absorb exposure light and transmit alignment light.

In such a positional relationship given with offsets, pre-exposure positional deviation measurement is done for a sample shot (1) in the case of global alignment, or in units of shots (2) in the case of die-by-die alignment. Assume that the positional deviation measurement values obtained at that time are (xm, ym).

Figure 8C:
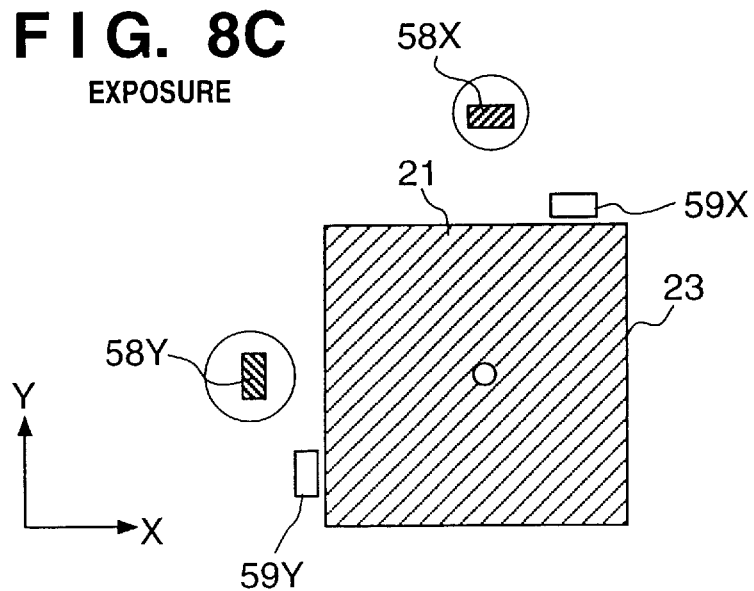

FIGS. 7B and 8C show the state upon exposure. After the positional deviation values are obtained by the measurement in FIG. 7A, the wafer stage is driven in a direction to correct the detected positional deviation values (xm, ym), and exposure is then made. At this time, the offsets (−Xb, Yb) and (−Xd, Yd) given upon alignment measurement are not reflected (the offsets are set at "0").

FIG. 7B also shows the exposure area defined by the aperture blades 7. SR light used in exposure is not an ideal point light source but has a predetermined size. As a result, as shown in FIG. 7B, the shade of the aperture blades 7 does not form a sharp image but forms a half-shade blur having a size around 10 μm on the wafer. When the position of each aperture blade 7 is determined so that a half-shade area is set to fall within the absorption area 22 between the wafer-side alignment mark 59x' for the next layer and the mask-side alignment mark 58x, as shown in FIG. 7B, half-shade blur on the wafer can be prevented. The aperture blades are similarly set in the X-direction.

The mask-side alignment marks 58x and 58y are not transferred onto the wafer 9, and do not influence the wafer-side alignment marks 59x and 59y, since they are not irradiated with the exposure light, i.e., the exposure light is intercepted by the aperture blades 7. In fig. 7B, the mark 59x' seems to be located on the mark 59x. However, these two marks deviate in the direction perpendicular to the plane of paper, and do not overlap each other. Also, since the wafer-side alignment marks 59x' and 59y' used in the next layer are irradiated with uniform exposure light, the marks are transferred onto the wafer with desired precision.

In this embodiment, X- and Y-deviations can be measured based on the X- and Y-alignment marks located around an IC circuit using the alignment optical system which is fixed outside the exposure area. Since the alignment optical system is located at a position where it does not spatially interfere with the area of exposure light, if positional deviation is measured by driving the wafer stage in units of mark measurements, a stage for moving the alignment optical system can be omitted, thus contributing to a simple apparatus and low cost.

Furthermore, as compared to the prior art in which a projection optical system is located on one side of the field angle, and a light-receiving optical system is located a position to face it, the alignment detection system can be simplified, and the occupied area around the mask can be reduced.

Figure 9A:
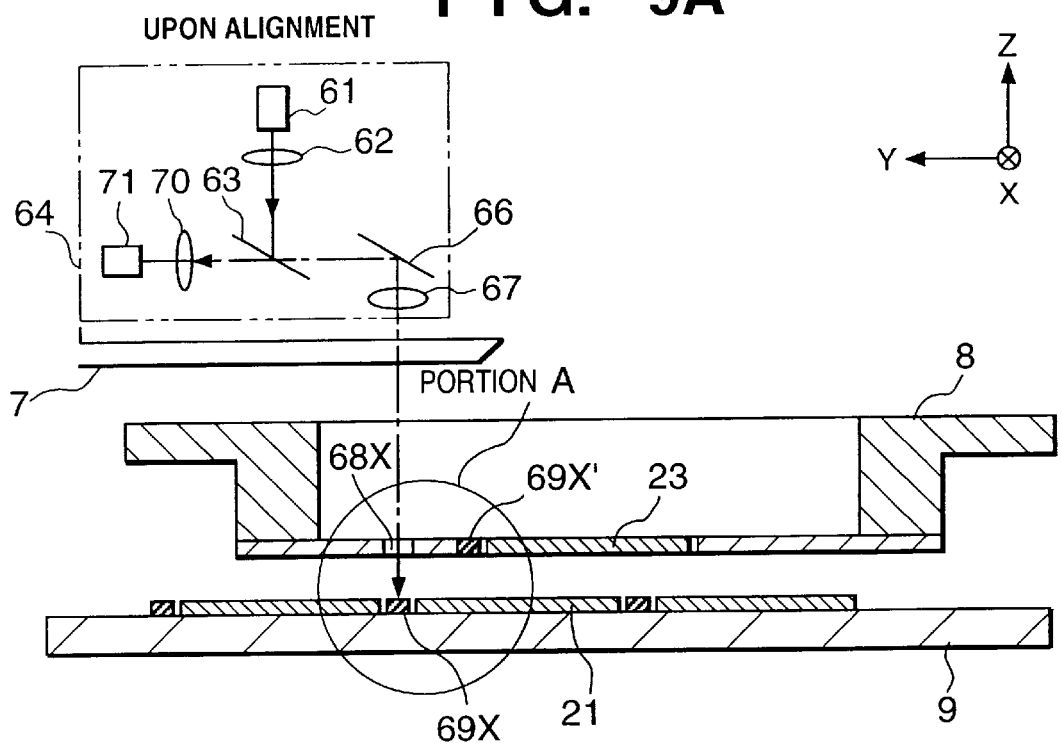
FIGS. 9A and 9B are views showing an alignment device for a semiconductor exposure apparatus according to the third embodiment of the present invention.
Figure 9B:
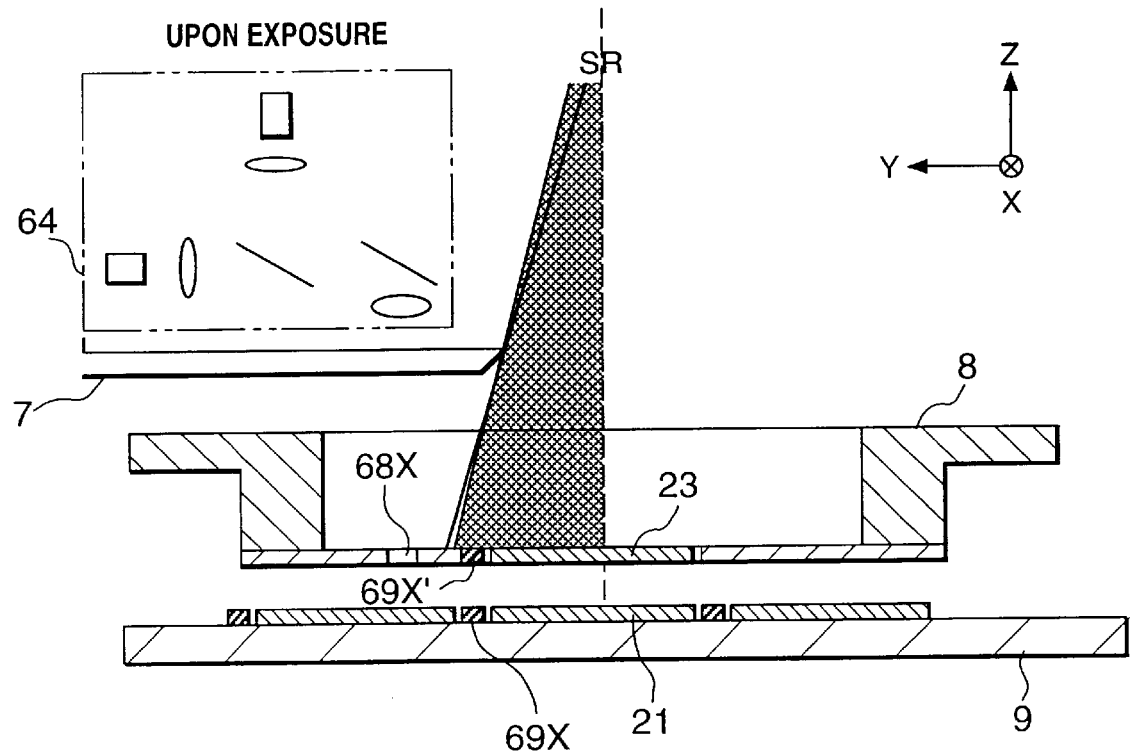

FIGS. 9A and 9B show the third embodiment of the present invention, i.e., schematic views showing an optical system in which the present invention is applied to relative alignment between a mask and wafer in an X-ray proximity exposure apparatus. In the aforementioned embodiments, the relative deviations between the alignment marks on the mask and wafer are directly measured to attain alignment. However, this embodiment exemplifies a wafer alignment method in which the mask is aligned to a reference of the apparatus, and the wafer is then aligned with reference to the apparatus reference. In this case, the mask is aligned to the apparatus reference in advance by a known means.

Referring to FIGS. 9A and 9B, light emitted by a light source 61 in an alignment detection system 64 is shaped in an illumination optical system 62, and is then reflected by a half mirror 63 and mirror 66. Subsequently, the light is transmitted through an aperture blade 7 located between the alignment detection system 64 and a mask 8, and an aperture 68x on the mask 8, and then hits an alignment mark 69x on a wafer 9. The aperture 68x is formed to observe the alignment mark 69x at a fixed observation position with respect to the apparatus in advance. The mask has already been aligned to the apparatus, and the position of the aperture 68x formed on the aligned mask can be determined in advance since the observation position of the alignment detection system 64 of the exposure apparatus is known. An image of the alignment mark 69x irradiated with the light via the aperture 68x is formed on a one-dimensional line sensor 71 by an imaging optical system built by a lens 67, mirror 66, and lens 70.

Figure 10:
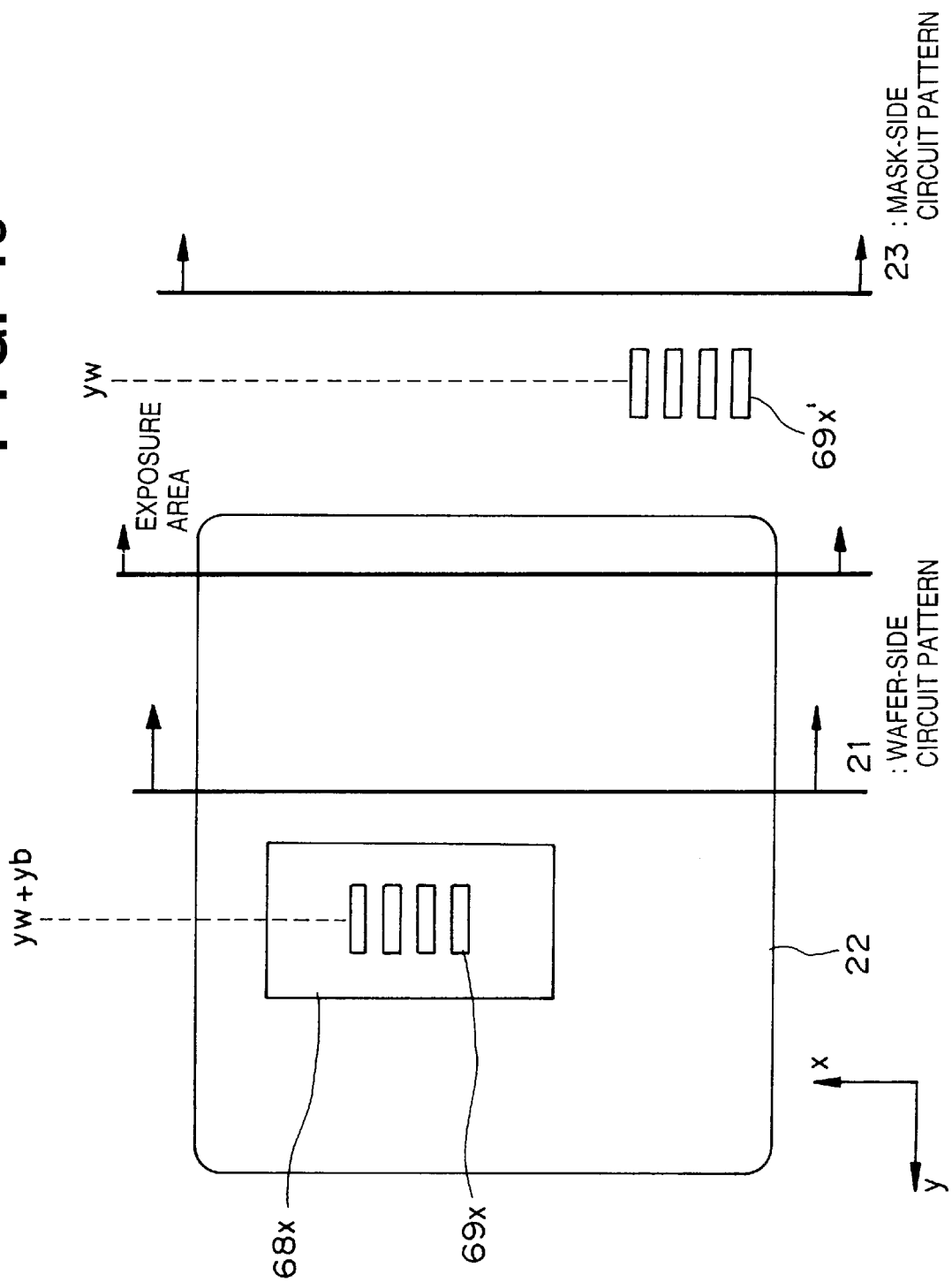
FIG. 10 is a plan view showing the pattern layout on a mask in the third embodiment in detail.
Figure 11:
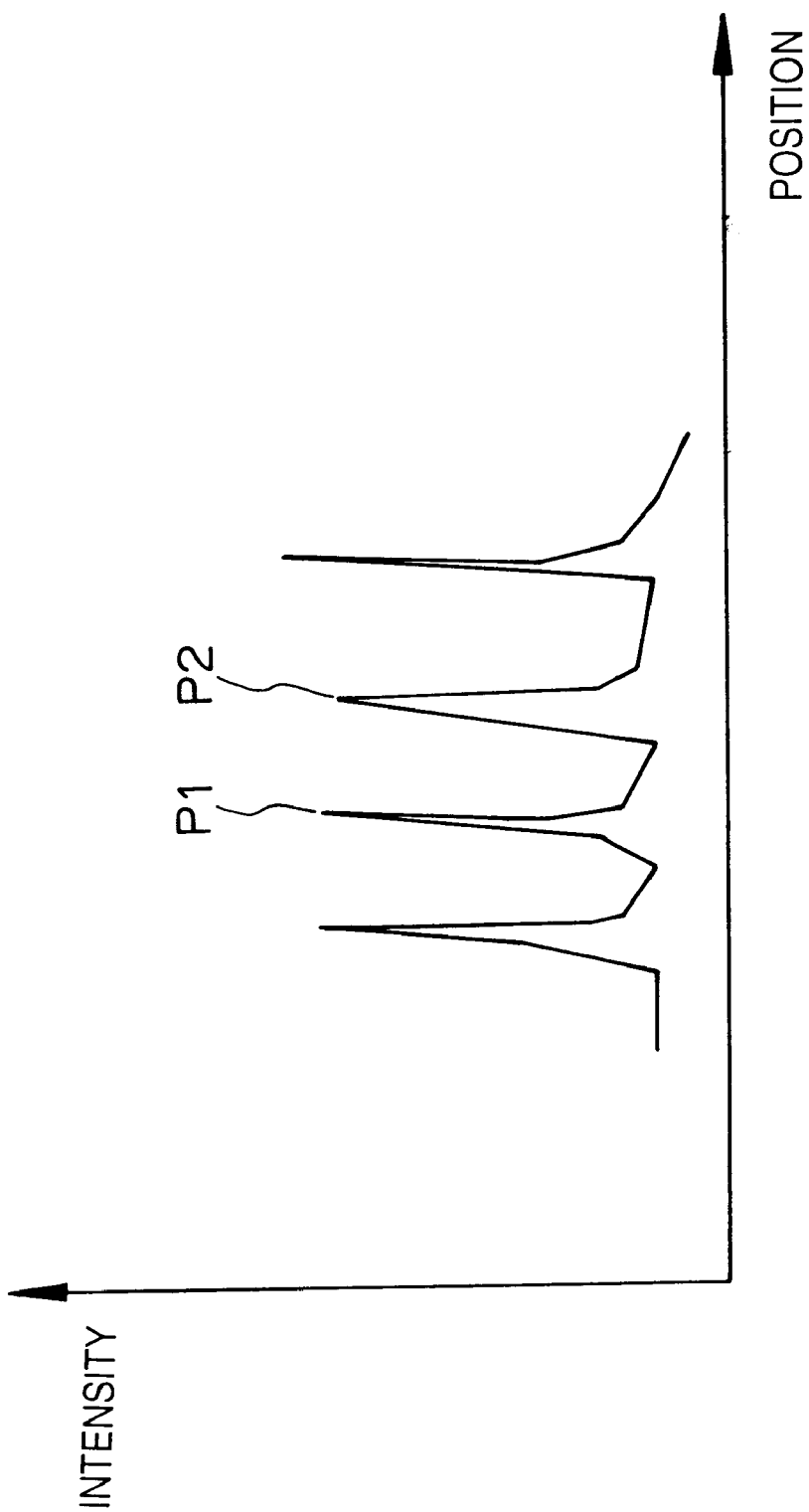
FIG. 11 is a graph showing the signal output in the third embodiment.

FIG. 11 shows the output from the line sensor 71. By dividing any displacement from the reference position at the average position between peak positions P1 and P2 by the magnification of the imaging optical system, the positional deviation of the wafer 9 is detected. FIG. 10 is an enlarged view of a portion A in FIG. 9B when viewed from the Z-direction. The peripheral portion of the membrane on the mask 8 has a non-transmission portion 22 which transmits neither alignment light nor exposure light, and the aperture 68x is formed there. As shown in FIG. 10, a pattern 69x' that forms the wafer mark is located at a position (y=yw) where the mark is transferred onto the wafer, and the mask aperture 68x is located at a position (y=yw+yb) where its image is not transferred onto the wafer. With such a mark layout, as for deviation in the X-direction, an X-deviation xm is measured by shifting the wafer stage by yb in the Y-direction from the designed overlapping position of the circuit patterns 21 and 23. As for deviation in the Y-direction, a Y-deviation ym is measured by shifting the wafer stage by xb in the X-direction from the overlapping position of the patterns 21 and 23. In this way, the wafer 9 can be aligned to the apparatus.

FIG. 9B shows the positional relationship upon exposure. In FIG. 9B, the wafer is aligned to the mask by reflecting the deviation values (xm, ym). In this embodiment as well, since the alignment detection system 64 is located at a position where it does not intercept exposure light which illuminates within the exposure field angle, the need for a stage for driving the detection system can be obviated.

Figure 12:
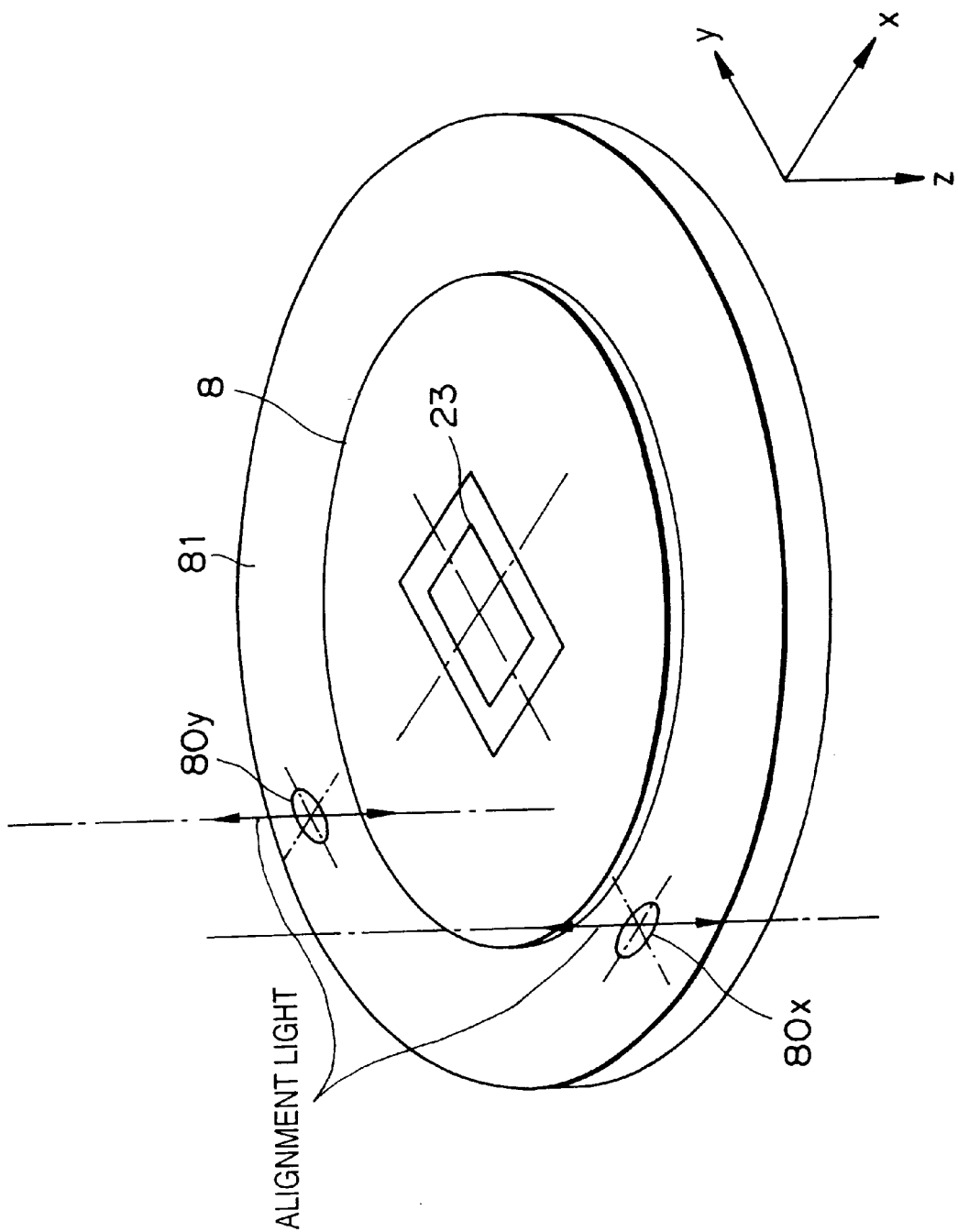
FIG. 12 is a perspective view showing a mask and mask frame structure according to the third embodiment of the present invention.

In the third embodiment, the aperture is formed on the mask membrane region. Alternatively, in the fourth embodiment shown in FIG. 12, alignment apertures 80x and 80y are formed on a mask frame 81, a n d apertures are also formed on a mask chuck that chucks the mask at the same positions. Also, an alignment detection system is fixed in position to observe wafer-side alignment marks via these apertures. In this case, the reference position of the exposure apparatus corresponds to each aperture of the mask chuck. In the layout shown in FIG. 12, the wafer stage is moved so that the wafer-side alignment marks are located immediately below the apertures, and the wafer-side alignment marks are irradiated with alignment light via the apertures, thus attaining alignment. The moving amount of the wafer stage at that time corresponds to the offset value at that time, and the deviation between the wafer and mask is obtained by subtracting this offset value from the measured value. In this embodiment as well, since the alignment detection system 64 is located at a position where it does not intercept exposure light which illuminates within the exposure field angle, the need for a stage for driving the detection system can be obviated.

As has been described in the above embodiments, since the alignment detection system is fixed at a position where it does not intercept exposure light, the system arrangement of the alignment detection system can be greatly simplified. Furthermore, in the present invention, since the mask-side alignment mark is not transferred to or in the vicinity of the wafer-side alignment mark, the number of times of updating the wafer-side alignment marks can be reduced. Also, as compared to an off-axis alignment system in which the alignment system is located at a position separated from the mask, the base line length as the difference between the alignment position and exposure position can be shortened, and the influence of drift of a wafer stage system can be reduced, thus improving alignment precision.

As one characteristic feature of the present invention, since alignment detection is attained via the aperture of the mask, and the wafer is moved to a position different from the exposure position upon detection, the wafer must be driven from the alignment detection position upon exposure. For this reason, a die-by-die alignment sequence can be attained, but its merit cannot be fully utilized due to the influence of wafer drive precision. Therefore, the present invention is suitable for global alignment that utilizes stage precision for driving the wafer from the initial position.

In the embodiments of the present invention, an alignment sequence in only one direction has been explained for the sake of simplicity. However, in practice, since two-dimensional alignment is required, X- and Y-measurements are always done, as shown in FIGS. 8A to 8C. The X- and Y-measurements may be done at the same time or separately depending on the layout of alignment marks.

The present invention is not limited to the aforementioned alignment method, and can be similarly applied to an image processing method disclosed in Japanese Patent Laid-Open No. 10-335241 by the present applicant.

In the aforementioned embodiments of the present invention, the aperture blades located between the alignment detection system and mask have a spectral transmittance that does not transmit exposure light but transmits alignment light. However, the aperture blades according to the present invention may adopt another embodiment.

As another embodiment of the aperture blades, a hole may be formed on a portion of an aperture blade, and alignment between the mask and wafer may be done via the hole. In this case, since the aperture blade moves in correspondence with a change in exposure range, the hole size increases.

More specifically, the position of the aperture blade must be changed in correspondence with a change in exposure range. At this time, since the alignment detection position is fixed with respect to the mask, as described above, the distance between the end of the aperture blade and alignment position of the mask changes by the moving amount of the aperture blade. When the hole size of the aperture blade is increased in correspondence with such a change, alignment detection can be attained in correspondence with the change in exposure range.

When stray light or the like exposes the wafer via the hole of the aperture blade upon exposure, a second aperture blade driven independently of the aforementioned aperture blade (first aperture blade) 7 may be prepared. The second aperture blade can be driven to a position where alignment light can be transmitted through the hole of the first aperture blade 7 upon alignment, and to a position where it can intercept stray light or the like with respect to the hole of the aperture blade 7 upon exposure. The second aperture blade may be prepared independently in the X- and Y-directions. Alternatively, if X- and Y-alignment marks on the mask can be covered by a single aperture blade, only one aperture blade may be prepared.

Driving of the second aperture blade need not be precisely controlled when the second aperture blade has a size appropriately larger than the hole of the first aperture blade 7. Since the need for high-precision control can be obviated, high-speed driving can be made, and an apparatus arrangement that does not suffer any total throughput drop can be realized.

The fourth embodiment of the present invention will be described below. In this embodiment, the present invention is applied to a relative alignment device between a mask and wafer for an X-ray proximity exposure apparatus, and the apparatus arrangement is basically the same as that of the first embodiment (FIG. 1). In the first embodiment, shots on the wafer are separated by the absorption member on the peripheral region of the mask. However, the absorption member cannot absorb all X-rays, which may reach the wafer at a transmittance of, e.g., 10% or higher. At this time, a region including neighboring shots is multiple-exposed by light transmitted through the absorption member, and neighboring shots cannot be sufficiently separated. For this reason, it is effective to separate neighboring shots by intercepting X-rays by the aperture blades of the exposure apparatus.

This embodiment uses a mask including a plurality of circuit patterns within one shot, and alignment marks are located only on the scribe line between neighboring circuit patterns but are not located on the scribe line between neighboring shots, thereby decreasing the width of the scribe line upon separating shots using the aperture blade.

As shown in FIGS. 13A and 13B, the mask used in this embodiment includes a plurality of IC circuit patterns (91, 92, 93, and 94; 95, 96, 97, and 98) located within an effective exposure field angle. Using this mask, a plurality of IC circuit patterns are transferred by a single exposure, thus improving the throughput.

As shown in FIG. 13A, alignment marks 19$x$ and 19$y$ are located on the scribe line among the plurality of IC circuit patterns (91, 92, 93, and 94) within the effective exposure field angle.

Figure 14:
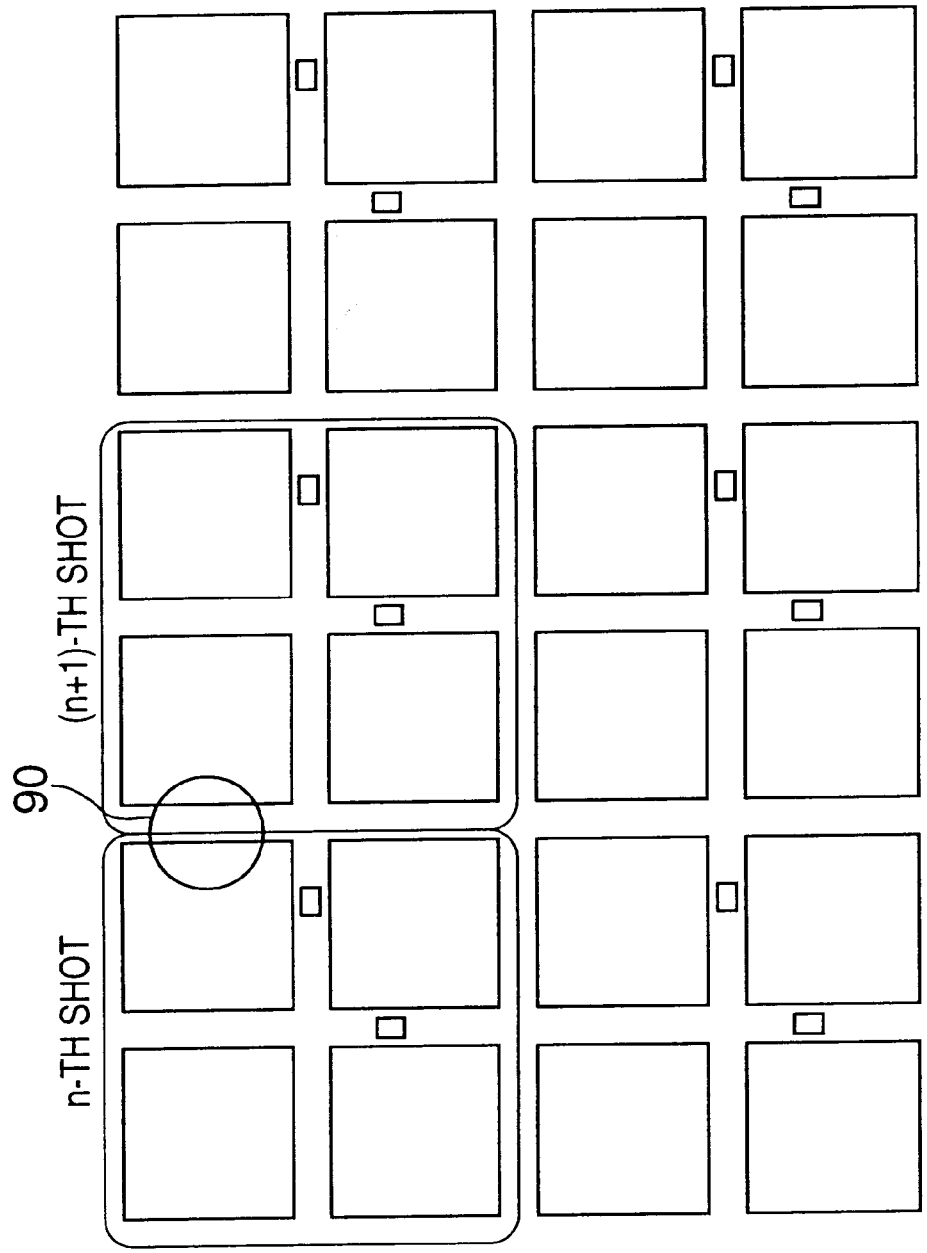
FIG. 14 is a plan view showing the pattern layout on a wafer in the fourth embodiment.

Using the mask shown in FIG. 13A, the mask is aligned using mask alignment marks 20, as described in the first embodiment, and the circuit patterns are transferred onto a wafer, as shown in FIG. 14. In the next semiconductor lithography process, a mask 8 shown in FIG. 13B is similarly aligned using the mask alignment marks 20. On the mask 8, mask-side alignment marks 18$x$ and 19$x$ are located outside the effective exposure field angle, as shown in FIG. 13B.

When a wafer 9 with the shot layout shown in FIG. 14 is mounted on the exposure apparatus of this embodiment, and is aligned, as described above, positional deviations are measured by an alignment detection system 6 while the wafer 9 opposes the mask 8. At this time, a wafer stage is aligned to the overlapping position in design of the mask-side alignment mark 18$x$ and wafer-side alignment mark 19$x$, i.e., by giving offsets corresponding to shift amounts (−Xb, Yb) shown in FIG. 3.

Exposure will be explained with reference to FIGS. 15A to 15C. As mentioned above, after the positional deviations are measured, the wafer stage is driven in a direction to correct the positional deviation measurement values (xm, ym), and exposure is then made. At this time, the offsets (−Xb, Yb) given upon alignment are not given.

Figure 15A:
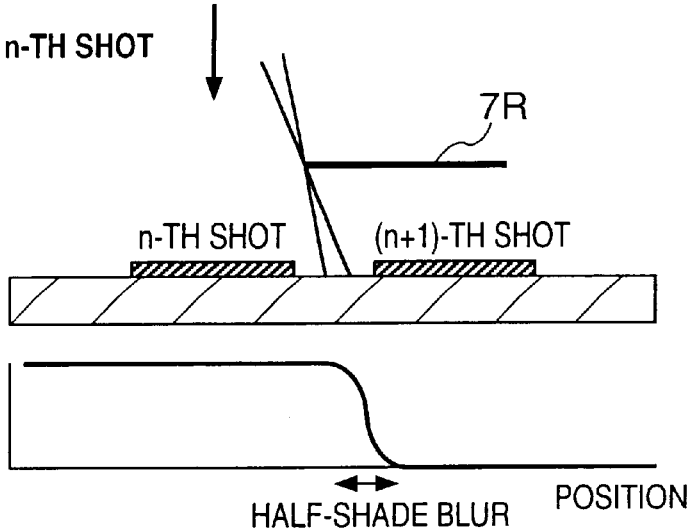
FIGS. 15A to 15C are views showing the exposure method of the fourth embodiment.
Figure 15B:
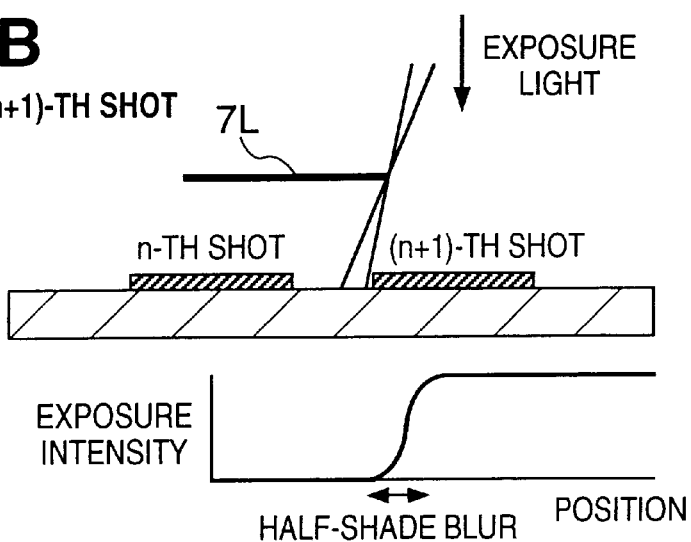
Figure 15C:
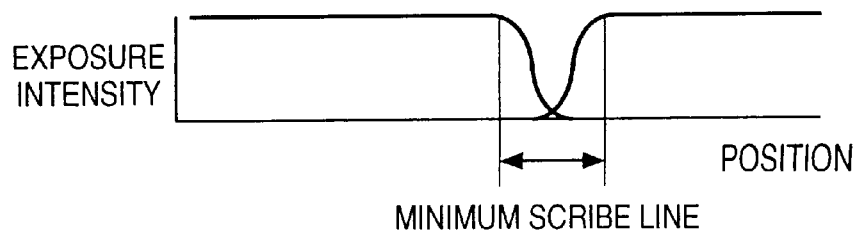
Figure 16:
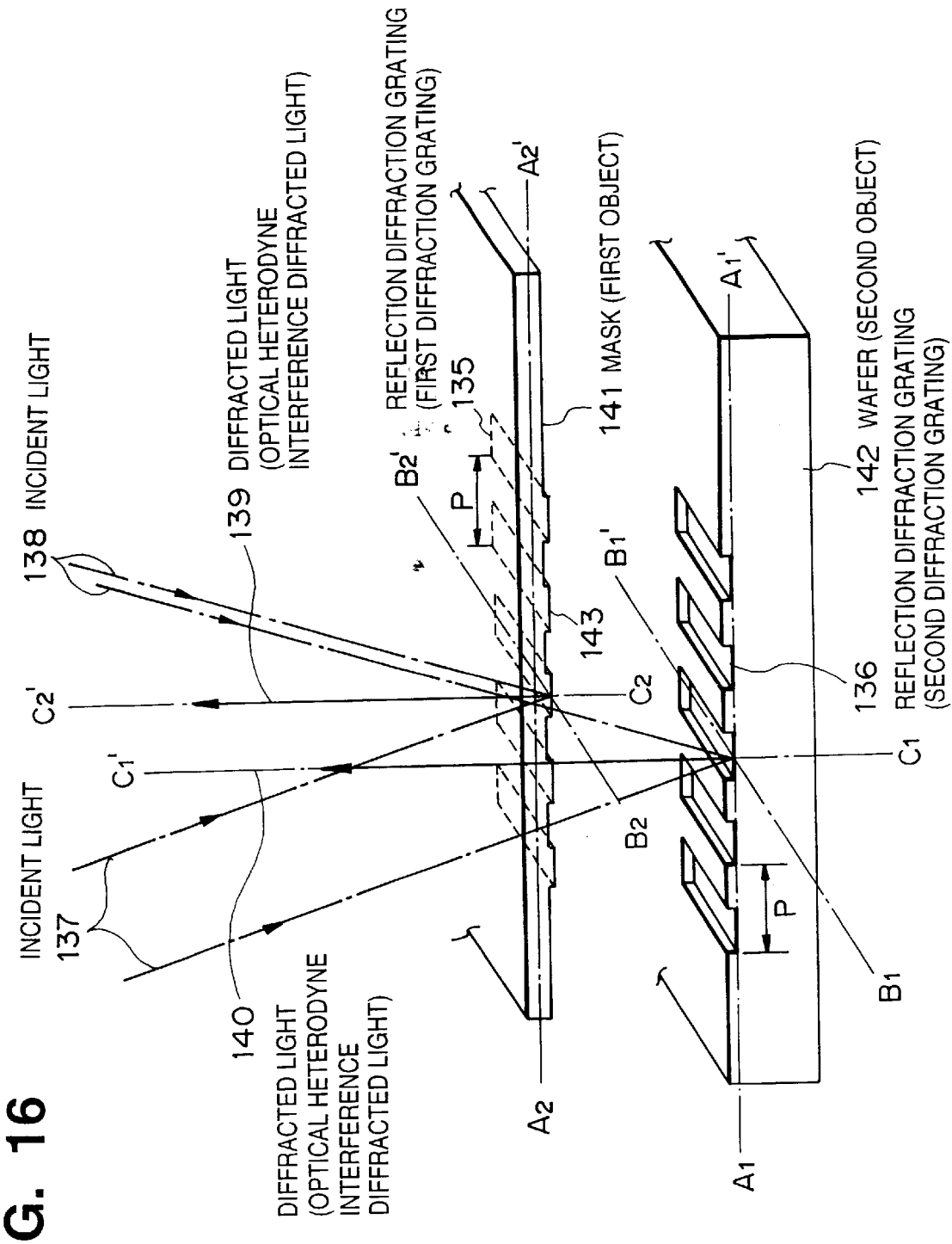
FIG. 16 is a view showing a conventional alignment method.

FIGS. 15A to 15C illustrate the state upon exposure of a scribe line (that between neighboring shots) in a region 90 shown in FIG. 14. Upon exposure of the n-th shot, exposure light is intercepted by a right aperture blade 7R so as not to expose the neighboring (n+1)-th shot.

Upon exposure of the (n+1)-th shot, exposure light is intercepted by a left aperture blade 7L so as not to expose the neighboring n-th shot. Likewise, the upper and lower neighboring shots are prevented from double-exposure by upper and lower aperture blades. The aperture blades 7 are aligned so that half-shade blurs of the aperture blade do not overlap each other on the scribe line, as shown in FIG. 15C.

Since no alignment marks need be transferred by exposure onto the scribe line that neighbors the shots, the minimum scribe line width is determined by the sum of the half-shade blur amount (×2) of the aperture blades and the setting errors of the aperture blades.

In this manner, when the exposure method and apparatus of this embodiment are used, upon separating shots by intercepting X-rays by the aperture blades of the exposure apparatus, the scribe line width on the wafer can be reduced, thus effectively using the wafer.

This embodiment is not limited to the alignment method of the first embodiment, but may use those described in the second and third embodiments.

To restate, according to the present invention, the mask-side alignment masks are located outside the frame to be exposed by shifting the marks by predetermined offsets from their original positions, and the layout of the alignment detection system, sequence control of the apparatus main body, and setup of the aperture blades are made in correspondence with the layout of the alignment marks. With this layout, since the mask-side alignment marks are not transferred, the wafer-side alignment marks need not be updated unnecessarily, and the number of times of updating can be reduced. The setup of the aperture blades is determined by the layout of the alignment marks and constants of the apparatus. For this reason, the wafer-side alignment marks can be updated at a desired timing in correspondence with the progress of semiconductor processes.

The offset layout of the mask-side alignment marks which are located outside the frame to be exposed provides the ability to set the alignment detection system at a position where it does not intercept exposure light in the proximity exposure apparatus. For this reason, when alignment marks are located at predetermined positions on the mask, i.e., fixed positions on the exposure apparatus, and these fixed positions are always observed by the alignment detection system, the alignment detection system need not be moved upon exposure. As a consequence, the exposure apparatus need not have any drive mechanism for the alignment detection system, thus simplifying the apparatus. Note that the stage drive amount is determined to allow wafer observation at the fixed positions.

The present invention is not limited to the above embodiments and various changes and modifications can be made within the spirit and scope of the present invention. Therefore, to apprise the public of the scope of the present invention the following claims are made.

What is claimed is:

1. An exposure apparatus for aligning a wafer and mask, and transferring a pattern on the mask onto the wafer, said apparatus comprising:
   a wafer stage for mounting a wafer formed with a first alignment mark;
   a mask holder for holding a mask formed with a second alignment mark at a position outside an exposure field angle;
   a detection unit for optically detecting a positional deviation between the first and second alignment marks;
   a calculation unit for calculating a positional deviation between a first pattern formed on the wafer and a second pattern formed on the mask on the basis of a detection result of said detection unit, a position of the first alignment mark in the wafer, and a position of the second alignment mark in the mask; and
   an actuator for adjusting a positional relationship between the wafer and mask on the basis of a calculation result of said calculation unit to make the first and second patterns overlap each other.

2. The apparatus according to claim 1, wherein said detection unit is fixed at a position where said detection unit does not intercept exposure light upon transferring the second pattern onto the wafer.

3. The apparatus according to claim 1, wherein the first alignment mark includes a first X-detection mark and first Y-detection mark, the second alignment mark includes a second X-detection mark and second Y-detection mark, and said detection unit has an X-positional deviation detector for detecting a positional deviation between the first and second X-detection marks, and a Y-positional deviation detector for detecting a positional deviation between the first and second Y-detection marks.

4. The apparatus according to claim 1, further comprising an aperture blade, located between the mask held by said mask holder and said detection unit, to define the exposure field angle.

5. The apparatus according to claim 4, further comprising a drive unit for changing a position of said aperture blade.

6. The apparatus according to claim 4, wherein the mask has a light-shielding portion around the second pattern, and said aperture blade intercepts marginal rays of the exposure light to locate an outer peripheral portion of the exposure light within the light-shielding portion.

7. The apparatus according to claim 4, wherein said aperture blade intercepts the exposure light, and transmits alignment light used by said detection unit to detect positions of the alignment marks.

8. The apparatus according to claim 4, wherein said aperture blade has an aperture for transmitting alignment light used by said detection unit to detect positions of the alignment marks.

9. The apparatus according to claim 8, further comprising a second aperture blade for preventing the exposure light from being transmitted through the aperture and hitting the wafer upon exposure.

10. The apparatus according to claim 1, wherein the mask has a light-shielding portion around the second pattern, and the second alignment mark is formed outside the second pattern.

11. The apparatus according to claim 1, further comprising an exposure light source for emitting X-rays as the exposure light.

12. The apparatus according to claim 4, wherein while central axes of the first and second patterns agree with each other, said apparatus satisfies:

$$Y1+Ym/2+Yc/2-L\cdot\tan(\theta) < Ya < Y2-Ym/2-Yc/2-L\cdot\tan(\theta)$$

where Ya is the distance from the central axis to a distal end of said aperture blade, L is the distance from said aperture blade to the mask, θ is a divergent angle of the exposure light at the distal end of said aperture blade, Yc is the half-shade blur amount of the exposure light on the mask under an influence of said aperture blade, Y1 is the distance from the central axis to the first alignment mark, Y2 is the distance from the central axis to a center of the second alignment mark, and Ym is a width of each of the first and second alignment marks.

13. An exposure apparatus for aligning a wafer and mask, and transferring a pattern on the mask onto the wafer, said apparatus comprising:
a wafer stage for mounting a wafer formed with an alignment mark;
a mask holder for holding a mask formed with an alignment light transmission portion at a position outside an exposure field angle;
a detection unit for detecting a position of the alignment mark by irradiating the alignment mark with alignment light via the alignment light transmission portion;
a calculation unit for calculating a positional deviation between a first pattern formed on the wafer and a second pattern formed on the mask on the basis of a detection result of said detection unit, a position of the alignment mark in the wafer, and a position of the alignment light transmission portion in the mask; and
an actuator for adjusting a positional relationship between the wafer and mask on the basis of a calculation result of said calculation unit to make the first and second patterns overlap each other.

14. The apparatus according to claim 13, wherein said detection unit is fixed at a position where said detection unit does not intercept exposure light upon transferring the second pattern onto the wafer.

15. The apparatus according to claim 13, wherein the alignment mark includes an X-detection mark and Y-detection mark, the alignment light transmission portion includes an X-detection transmission portion and Y-detection transmission portion, and said detection unit has an X-position detector for detecting a position of the X-detection mark by irradiating the X-detection mark with the alignment light via the X-detection transmission portion, and a Y-position detector for detecting a position of the Y-detection mark by irradiating the Y-detection mark with the alignment light via the Y-detection transmission portion.

16. The apparatus according to claim 13, further comprising an aperture blade, located between the mask held by said mask holder and said detection unit, to define the exposure field angle.

17. The apparatus according to claim 16, wherein the mask has a light-shielding portion around the second pattern, and said aperture blade intercepts marginal rays of the exposure light to locate an outer peripheral portion of the exposure light within the light-shielding portion.

18. The apparatus according to claim 13, wherein the mask has a light-shielding portion around the second pattern, and the alignment light transmission portion is formed outside the second pattern.

19. The apparatus according to claim 13, further comprising an exposure light source for emitting X-rays as the exposure light.

20. The apparatus according to claim 14, wherein while central axes of the first and second patterns agree with each other, said apparatus satisfies:

$$Y1+Ym/2+Yc/2-L\cdot\tan(\theta) < Ya < Y2-Ym/2-Yc/2-L\cdot\tan(\theta)$$

where Ya is the distance from the central axis to a distal end of said aperture blade, L is the distance from said aperture blade to the mask, $\theta$ is a divergent angle of the exposure light at the distal end of said aperture blade, Yc is the half-shade blur amount of the exposure light on the mask under an influence of said aperture blade, Y1 is the distance from the central axis to the alignment mark, Y2 is the distance from the central axis to the alignment light transmission portion, and Ym is a width of each of the alignment mark and alignment light transmission portion.

21. An exposure apparatus for aligning a wafer and mask, and transferring a pattern on the mask onto the wafer, said apparatus comprising:
a wafer stage for mounting a wafer formed with an alignment mark;
a mask holder formed with an alignment light transmission portion at a position outside of an exposure field angle;
a detection unit for detecting a position of the alignment mark by irradiating the alignment mark with alignment light via the alignment light transmission portion;
a calculation unit for calculating a positional deviation between a first pattern formed on the wafer and a second pattern formed on a mask on the basis of a detection result of said detection unit, a position of the alignment mark in the wafer, and a positional relationship between the alignment light transmission portion and the mask held by said mask holder; and
an actuator for adjusting a positional relationship between the wafer and mask on the basis of a calculation result of said calculation unit to make the first and second patterns overlap each other.

22. The apparatus according to claim 21, wherein said detection unit is fixed at a position where said detection unit does not intercept exposure light upon transferring the second pattern onto the wafer.

23. The apparatus according to claim 21, wherein the alignment mark includes an X-detection mark and Y-detection mark, the alignment light transmission portion includes an X-detection transmission portion and a Y-detection transmission portion, and said detection unit has an X-position detector for detecting a position of the X-detection mark by irradiating the X-detection mark with the alignment light via the X-detection transmission portion, and a Y-position detector for detecting a position of the Y-detection mark by irradiating the Y-detection mark with the alignment light via the Y-detection transmission portion.

24. The apparatus according to claim 21, further comprising an aperture blade, located between the mask held by said mask holder and said detection unit, to define the exposure field angle.

25. The apparatus according to claim 24, wherein the mask has a light-shielding portion around the second pattern, and said aperture blade intercepts,marginal rays of the exposure light to locate an outer peripheral portion of the exposure light within the light-shielding portion.

26. The apparatus according to claim 21, further comprising an exposure light source for emitting X-rays as the exposure light.

27. The apparatus according to claim 24, wherein while central axes of the first and second patterns agree with each other, said apparatus satisfies:

$$Y1+Ym/2+Yc/2-L\cdot\tan(\theta) < Ya < Y2-Ym/2-Yc/2-L\cdot\tan(\theta)$$

where Ya is the distance from the central axis to a distal end of said aperture blade, L is the distance from said aperture blade to the mask, $\theta$ is a divergent angle of the exposure light at the distal end of said aperture blade, Yc is the half-shade blur amount of the exposure light on the mask under an influence of said aperture blade, Y1 is the distance from the central axis to the alignment mark, Y2 is the distance from the central axis to the alignment light transmission portion, and Ym is a width of each of the alignment mark and alignment light transmission portion.

28. An exposure method for aligning a wafer and mask, and transferring a pattern on the mask onto the wafer, said method comprising:

the detection step of optically detecting a positional deviation between a first alignment mark formed on a wafer and a second alignment mark formed on a mask outside an exposure field angle;

the calculation step of calculating a positional deviation between a first pattern formed on the wafer and a second pattern formed on the mask on the basis of a detection result in the detection step, a position of the first alignment mark in the wafer, and a position of the second alignment mark in the mask; and the adjustment step of adjusting a positional relationship between the wafer and mask on the basis of a calculation result in the calculation step to make the first and second patterns overlap each other.

29. An exposure method for aligning a wafer and mask, and transferring a pattern on the mask onto the wafer, said method comprising:

the detection step of detecting a position of an alignment mark formed on a wafer by irradiating the alignment mark with alignment light via an alignment light transmission portion formed on a mask outside an exposure field angle;

the calculation step of calculating a positional deviation between a first pattern formed on the wafer and a second pattern formed on the mask on the basis of a detection result in the detection step, a position of the alignment mark in the wafer, and a position of the alignment light transmission portion in the mask; and the adjustment step of adjusting a positional relationship between the wafer and mask on the basis of a calculation result in the calculation step to make the first and second patterns overlap each other.

30. An exposure method for aligning a wafer and mask, and transferring a pattern on the mask onto the wafer, said method comprising:

the detection step of detecting a position of an alignment mark formed on a wafer by irradiating the alignment mark with alignment light via an alignment light transmission portion formed on a mask holder at a position outside of an exposure field angle;

the calculation step of calculating a positional deviation between a first pattern formed on the wafer and a second pattern formed on a mask on the basis of a detection result in the detection step, a position of the alignment mark in the wafer, and a positional relationship between the alignment light transmission portion and the mask held by said mask holder; and the adjustment step of adjusting a positional relationship between the wafer and the mask on the basis of a calculation result in the calculation step to make the first and second patterns overlap each other.

31. An exposure method for transferring patterns for a plurality of chips by a single exposure, said method comprising:

(a) a first lithography step including a first exposure step of transferring, from a first mask on which first patterns for a plurality of chips are formed to sandwich a scribe line therebetween, and a first alignment mark is formed on a scribe line between neighboring chips, the first pattern and first alignment mark onto a wafer; and (b) a second lithography step including an alignment step of aligning a second mask on which second patterns for a plurality of chips are formed to sandwich a scribe line therebetween, and a second alignment mark is formed outside an exposure field angle, to the wafer using the second alignment mark and the first alignment mark formed on the wafer in the first lithography step, and a second exposure step of transferring the second patterns from the second mask onto the wafer.

32. The method according to claim 31, wherein the first and second exposure steps include the step of performing exposure for a plurality of shots, and further comprising preventing multiple-exposure between neighboring shots by an aperture blade located between an exposure light source and the mask during the exposure.

33. A mask comprising:

a membrane region formed with a pattern to be exposed; and a mask frame formed with an alignment light transmission portion at a position other than said membrane region.

* * * * *

UNITED STATES PATENT AND TRADEMARK OFFICE
CERTIFICATE OF CORRECTION

PATENT NO. : 6,151,120
DATED : November 21, 2000
INVENTOR(S) : Takahiro Matsumoto, et al.

It is certified that error appears in the above-identified patent and that said Letters Patent is hereby corrected as shown below:

Column 2:
Line 1, "increasing" should read -- increase --.

Column 8:
Line 29, "low-cos t" should read -- low-cost --.

Column 13:
Line 6, "designed," should be -- designed --.

Column 22:
Line 43, "intercepts, marginal" should read -- intercepts marginal --.

Signed and Sealed this

Thirty-first Day of July, 2001

*Attest:*

*Nicholas P. Godici*

NICHOLAS P. GODICI
*Attesting Officer*   *Acting Director of the United States Patent and Trademark Office*